(12) United States Patent
DeVore et al.

(10) Patent No.: US 11,923,907 B2
(45) Date of Patent: *Mar. 5, 2024

(54) HIGH POWER HANDLING DIGITIZER USING PHOTONICS

(71) Applicant: Lawrence Livermore National Security, LLC, Livermore, CA (US)

(72) Inventors: Peter Thomas Setsuda DeVore, Livermore, CA (US); Apurva Shantharaj Gowda, Mountain View, CA (US); David Simon Perlmutter, Oakland, CA (US); Alexander Thomas Wargo, Livermore, CA (US); Jason Thomas Chou, Walnut Creek, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 32 days.

This patent is subject to a terminal disclaimer.

(21) Appl. No.: 17/634,522

(22) PCT Filed: Jul. 17, 2020

(86) PCT No.: PCT/US2020/042649
§ 371 (c)(1),
(2) Date: Feb. 10, 2022

(87) PCT Pub. No.: WO2021/011915
PCT Pub. Date: Jan. 21, 2021

(65) Prior Publication Data
US 2022/0337317 A1 Oct. 20, 2022

Related U.S. Application Data

(60) Provisional application No. 62/875,861, filed on Jul. 18, 2019.

(51) Int. Cl.
*H04B 10/54* (2013.01)
*G02B 27/28* (2006.01)
(Continued)

(52) U.S. Cl.
CPC ......... *H04B 10/541* (2013.01); *G02B 27/283* (2013.01); *G02B 27/286* (2013.01);
(Continued)

(58) Field of Classification Search
CPC .. H04B 10/541; H04B 10/25; H04B 10/2575; H04B 10/613; G02B 27/283;
(Continued)

(56) References Cited

U.S. PATENT DOCUMENTS 4,709,978 A 12/1987 Jackel
5,148,503 A 9/1992 Skeie
(Continued)

FOREIGN PATENT DOCUMENTS

CN 108768528 A 11/2018
JP 2001053684 A 2/2001
(Continued)

OTHER PUBLICATIONS

Su et al; Photonic analog-to-digital conversion with equivalent analog prefiltering by shaping sampling pulses; Jun. 2016; Optics Letters; pp. 1-4. (Year: 2016).*
(Continued)

*Primary Examiner* — Amritbir K Sandhu
(74) *Attorney, Agent, or Firm* — Perkins Coie LLP

(57) ABSTRACT

Devices, methods for analog-to-digital converters (ADCs) that perform high-dynamic range measurements based on optical techniques are disclosed. In one example aspect, an optical encoder includes a polarization rotator configured to receive a train of optical pulses, and an electro-optic (EO) modulator coupled to an output of the polarization rotator.

(Continued)

The EO modulator is configured to receive a radio frequency (RF) signal and to produce a phase modulated signal in accordance with the RF signal. The optical encoder also includes a polarizing beam splitter coupled to the output of the EO modulator; and an optical hybrid configured to receive two optical signals from the polarizing beam splitter and to produce four optical outputs that are each phase shifted with respect to one another.

19 Claims, 17 Drawing Sheets

(51) Int. Cl.
    *G02F 1/29*           (2006.01)
    *G02F 1/313*         (2006.01)
    *H03M 1/12*         (2006.01)
    *H03M 1/60*         (2006.01)
    *H04B 10/25*        (2013.01)
    *H04B 10/2575*     (2013.01)
    *H04B 10/61*        (2013.01)

(52) U.S. Cl.
    CPC ............ *G02F 1/292* (2013.01); *G02F 1/3131* (2013.01); *G02F 1/3136* (2013.01); *H03M 1/60* (2013.01); *H04B 10/25* (2013.01); *H04B 10/2575* (2013.01); *H04B 10/613* (2013.01); *G02F 2203/24* (2013.01); *G02F 2203/50* (2013.01); *H03M 1/12* (2013.01)

(58) Field of Classification Search
    CPC ..... G02B 27/286; G02F 1/292; G02F 1/3131; G02F 1/3136; H03M 1/60
    USPC ......................................................... 398/115
    See application file for complete search history.

(56) References Cited

U.S. PATENT DOCUMENTS

| | | |
|---|---|---|
| 5,249,243 A | 9/1993 | Skeie |
| 5,339,185 A | 8/1994 | Kaede |
| 5,408,544 A | 4/1995 | Seino |
| 5,627,637 A | 5/1997 | Kapteyn |
| 6,259,552 B1 | 7/2001 | Boffi et al. |
| 6,339,489 B1 | 1/2002 | Bruyere et al. |
| 6,462,844 B1 | 10/2002 | Kai et al. |
| 6,661,975 B1 | 12/2003 | Hall et al. |
| 6,671,298 B1 | 12/2003 | Delfyett et al. |
| 6,724,783 B2 | 4/2004 | Jalali et al. |
| 6,738,181 B1 | 5/2004 | Nakamoto et al. |
| 6,744,553 B1 | 6/2004 | Islam et al. |
| 7,133,135 B2 | 11/2006 | Dorrer |
| 7,209,664 B1 | 4/2007 | Mcnicol et al. |
| 7,259,901 B2 | 8/2007 | Parsons et al. |
| 7,352,504 B2 | 4/2008 | Hirooka et al. |
| 7,391,969 B2 | 6/2008 | Shpantzer et al. |
| 7,522,842 B1 | 4/2009 | Mcnicol et al. |
| 7,587,144 B2 | 9/2009 | Ilchenko et al. |
| 7,643,212 B1 | 1/2010 | Sokoloff et al. |
| 7,787,779 B2 | 8/2010 | Weiner et al. |
| 7,868,799 B1 | 1/2011 | Price et al. |
| 7,877,020 B1 | 1/2011 | Hayes et al. |
| 7,940,380 B1 | 5/2011 | Benner |
| 8,164,819 B2 | 4/2012 | Tu et al. |
| 8,442,402 B1 | 5/2013 | Zanoni et al. |
| 8,446,305 B1 | 5/2013 | Zanoni et al. |
| 8,456,336 B1 | 6/2013 | Zanoni et al. |
| 8,478,132 B1 | 7/2013 | Jepsen et al. |
| 8,503,887 B2 | 8/2013 | Kikuchi |
| 8,548,331 B1 | 10/2013 | Zanoni et al. |
| 8,779,955 B1 | 7/2014 | Zanoni et al. |
| 8,909,061 B1 | 12/2014 | Varadarajan |
| 8,934,058 B2 | 1/2015 | Chou et al. |
| 8,965,211 B1 | 2/2015 | Zanoni et al. |
| 9,077,455 B2 | 7/2015 | Randel et al. |
| 9,118,423 B1 | 8/2015 | Zanoni et al. |
| 9,197,471 B1 | 11/2015 | Zanoni et al. |
| 9,356,704 B1 | 5/2016 | Zanoni et al. |
| 9,645,291 B1 | 5/2017 | Sommer et al. |
| 9,843,398 B1 | 12/2017 | Zanoni et al. |
| 9,857,660 B1 | 1/2018 | Devore et al. |
| 9,888,303 B1 | 2/2018 | Jepsen et al. |
| 10,063,320 B2 | 8/2018 | Clark et al. |
| 10,069,619 B1 | 9/2018 | Zanoni et al. |
| 10,075,154 B1 | 9/2018 | Hsieh |
| 10,139,704 B1 | 11/2018 | Shamee et al. |
| 11,159,241 B2* | 10/2021 | DeVore ............... G02B 27/286 |
| 11,184,087 B2 | 11/2021 | Buckley et al. |
| 2001/0046077 A1 | 11/2001 | Akiyama et al. |
| 2002/0067747 A1 | 6/2002 | Jalali et al. |
| 2002/0167721 A1 | 11/2002 | Caplan |
| 2002/0176152 A1 | 11/2002 | Parolari et al. |
| 2003/0016439 A1 | 1/2003 | Courtois et al. |
| 2003/0058499 A1 | 3/2003 | Reingand et al. |
| 2003/0175037 A1 | 9/2003 | Kimmitt et al. |
| 2004/0004780 A1 | 1/2004 | Watanabe |
| 2004/0085620 A1 | 5/2004 | Kawanishi et al. |
| 2006/0127004 A1 | 6/2006 | Waters |
| 2007/0070493 A1 | 3/2007 | Kim et al. |
| 2007/0133918 A1 | 6/2007 | Cho et al. |
| 2007/0140705 A1 | 6/2007 | Shpantzer et al. |
| 2007/0273958 A1 | 11/2007 | Hirooka et al. |
| 2008/0030846 A1* | 2/2008 | Starodoumov ...... H01S 3/06754 359/341.2 |
| 2008/0212166 A1 | 9/2008 | Lett et al. |
| 2008/0285977 A1 | 11/2008 | Caplan |
| 2009/0142070 A1 | 6/2009 | Boduch et al. |
| 2010/0209121 A1 | 8/2010 | Tanimura |
| 2011/0064411 A1 | 3/2011 | Eiselt |
| 2011/0097085 A1 | 4/2011 | Oda et al. |
| 2011/0129230 A1* | 6/2011 | Zanoni ................. H04B 10/677 398/140 |
| 2011/0141478 A1 | 6/2011 | Sasaki et al. |
| 2011/0150478 A1 | 6/2011 | Winzer |
| 2012/0069854 A1 | 3/2012 | Suzuki |
| 2012/0082414 A1 | 4/2012 | Sakamaki et al. |
| 2012/0134667 A1* | 5/2012 | Westlund ............... H04B 10/60 398/25 |
| 2012/0148264 A1 | 6/2012 | Liu et al. |
| 2012/0212360 A1 | 8/2012 | Kanter et al. |
| 2012/0213532 A1 | 8/2012 | Hironishi et al. |
| 2012/0251031 A1 | 10/2012 | Suarez et al. |
| 2012/0263456 A1 | 10/2012 | Tanaka et al. |
| 2012/0274937 A1 | 11/2012 | Hays et al. |
| 2012/0288286 A1 | 11/2012 | Houtsma et al. |
| 2013/0062508 A1 | 3/2013 | Kanter et al. |
| 2013/0209089 A1 | 8/2013 | Harley et al. |
| 2013/0315597 A1 | 11/2013 | Shaver et al. |
| 2014/0146234 A1 | 5/2014 | Chou et al. |
| 2014/0233963 A1 | 8/2014 | Le Taillandier De Gabory |
| 2015/0016827 A1 | 1/2015 | Wilkinson et al. |
| 2015/0110494 A1 | 4/2015 | Ghelfi et al. |
| 2015/0207567 A1 | 7/2015 | Bogoni et al. |
| 2015/0341121 A1 | 11/2015 | Yue et al. |
| 2016/0248515 A1* | 8/2016 | Zheng .................... H04J 14/02 |
| 2017/0250776 A1 | 8/2017 | Morsy-osman et al. |
| 2018/0006730 A1 | 1/2018 | Kuo et al. |
| 2018/0034550 A1 | 2/2018 | Rakich et al. |
| 2018/0209851 A1 | 7/2018 | Bartels et al. |
| 2018/0294946 A1 | 10/2018 | Sinclair et al. |
| 2019/0041267 A1 | 2/2019 | Burghoff et al. |
| 2019/0072833 A1 | 3/2019 | Nejadriahi et al. |
| 2019/0097734 A1 | 3/2019 | Inagaki et al. |
| 2019/0187198 A1 | 6/2019 | Anderson et al. |
| 2019/0199443 A1 | 6/2019 | Zamani et al. |
| 2020/0150346 A1 | 5/2020 | Cavaliere et al. |
| 2020/0295838 A1 | 9/2020 | Gordon et al. |
| 2021/0021349 A1* | 1/2021 | DeVore ................... G02F 1/292 |
| 2021/0021914 A1* | 1/2021 | Perlmutter ......... H04Q 11/0005 |
| 2021/0044253 A1 | 2/2021 | Chao et al. |
| 2022/0085887 A1 | 3/2022 | Buckley et al. |

(56) References Cited

U.S. PATENT DOCUMENTS

| | | |
|---|---|---|
| 2022/0100047 A1 | 3/2022 | Gowda et al. |
| 2022/0231760 A1 | 7/2022 | Devore et al. |
| 2023/0163850 A1 | 5/2023 | Buckley et al. |

FOREIGN PATENT DOCUMENTS

| | | | |
|---|---|---|---|
| JP | 2007256323 A | 10/2007 | |
| JP | 2008141689 A | 6/2008 | |
| WO | 9613104 A1 | 5/1996 | |
| WO | 2007112449 A2 | 10/2007 | |
| WO | 2010059257 A1 | 5/2010 | |
| WO | 2017030532 A1 | 2/2017 | |
| WO | 2018059338 A1 | 4/2018 | |
| WO | WO-2019053296 A1 * | 3/2019 | .......... H03M 13/033 |

OTHER PUBLICATIONS

George et al; Demonstration of speckle-based compressive sensing system for recovering RF signals; Aug. 2018; Optics Express; pp. 1-13. (Year: 2018).*

Xu et al; Ultra-broadband silicon polarization splitter-rotator based on the multi-mode waveguide; Jul. 2017; Optics Express; pp. 1-7. (Year: 2017).*

Garcia et al; Driving the Analog Input of the HI5812 Family of 12-Bit Analog to Digital Converters; Dec. 2001; Intersil Technical brief; pp. 1-2. (Year: 2001).*

Golani et al; A photonic analog-to-digital converter using phase modulation and self-coherent detection with spatial oversampling; May 2014; Optical Society of America; pp. 1-11. (Year: 2014).*

Golani et al; A photonic analog-to digital converter using phase modulation and self-coherent detection with spatial oversampling; May 2014; pp. 1-11. (Year: 2014).*

Su et al; Photonic analog-to-digital conversion with equivalent analog prefiltering by shaping sampling pulses; 2016; Optics Letters; pp. 1-4. (Year: 2016).*

Stern, Liron, et al., "Controlling the interactions of space-variant polarization beams with rubidium vapor using external magnetic fields," Optics Express, vol. 24, No. 5, 2016.

Abo, M., A., et al., "A 1.5-V, 10-bit, 14.3-MS/s CMOS Pipeline Analog-to-Digital Converter," IEEE Journal of Solid-State Circuits, vol. 34, No. 5, May 1999.

Bao, X., et al., "Recent Progress in Distributed Fiber Optic Sensors," Sensors 2012, 12, 8601-8639.

Batagelj, B., et al., "Key Properties and Design Issues for an Opto-Electronic Oscillator," ICTON 2015.

Burns, K., W., et al., "Second Harmonic Generation in Field Poled, Quasi-Phase-Matched, Bulk LiNbO3," IEEE Photonics Technology Letters, vol. 6. No. 2, Feb. 1994.

Davari, B., et al., "CMOS Scaling for High Performance and Low Power—The Next Ten Years," Proceedings of the IEEE, vol. 83, No. 4, Apr. 1995.

De La Rosa, E., et al., "All-fiber absolute temperature sensor using an unbalanced high-birefringence Sagnac loop," Optics Letters, vol. 22, No. 7, Apr. 1, 1997.

Devore, S., T., P., et al., "Enhancing electrooptic modulators using modulation instability," Phys. Status Solidi RRL 7, No. 8 (2013).

Devore, S., T., P., et al., "Light-weight flexible magnetic shields for large-aperture photomultiplier tubes," Nuclear Instruments and Methods in Physics Research A 737(2014) 222-228.

Devore, S., T., P., et al., "Rogue events and noise shaping in nonlinear silicon photonics," Journal of Optics 15, 2013.

Devore, S., T., P., et al., "Stimulated supercontinuum generation extends broadening limits in silicon," Appl. Phys. Lett. 100, 101111 (2012).

Devore, S., T., P., et al., Coherent Time-Stretch Transform for Near-Field Spectroscopy, IEEE Photonics Journal, vol. 6, No. 2, Apr. 2014.

Dumin, J., D., et al., "Oxide Wearout, Breakdown, and Reliability," International Journal of High Speed Electronics and Systems, vol. 11, No. 3 (2001) 617-718.

Eickhoff, W., "Temperature sensing by mode-mode interference in birefringent optical fibers," Optics Letters, vol. 6, No. 4, Apr. 1981.

Eliyahu, D., et al., "Tunable, Ultra-Low Phase Noise YIG Based Opto-Electronic Oscillator," IEEE MTT-S Digest, 2003.

Fard, M., A., et al., "Impact of Optical Nonlinearity on Performance of Photonic Time-Stretch Analog-to-Digital Converter," Journal of Lightwave Technology, vol. 29, No. 13, Jul. 1, 2011.

Fortier, M., T., "Generation of ultrastable microwaves via optical frequency division," Nature Photonics, vol. 5, Jul. 2011.

Fortier, M., T., et al., "Optically referenced broadband electronic synthesizer with 15 digits of resolution," Laser Photonics Rev. 10, No. 5, 780-790 (2016).

Gee, M., C., et al., "Spurious-Free Dynamic Range of a High-Resolution Photonic Time-Stretch Analog-To-Digital Converter System," Microwave and Optical Technology Letters, vol. 54, No. 11, Nov. 2012.

Gee, M., C., et al., Spurious-Free Dynamic Range of a High-Speed Photonic Time-Stretch A/D-Converter System, Advanced Photonics Congress © 2012.

Ikeda, K., et al., "Optical quantizing and coding for ultrafast A/D conversion using nonlinear fiber-optic switches based on Sagnac interferometer," May 30, 2005, vol. 13, No. 11, Optics Express 4297.

International Searching Authority, International Search Report and Written Opinion, PCT Patent Application PCT/US2020/042649, dated Nov. 18, 2020, 10 pages.

Jiang, Y., et al., "Analog optical computing primitives in silicon photonics," Optics Letters, vol. 41, No. 6, Mar. 2016.

Juodawlkis, W., P., et al., "Optically Sampled Analog-to-Digital Converters," IEEE Transactions on Microwave Theory and Techniques, vol. 49, No. 10, Oct. 2001.

Kazovsky, "All-fiber 900 optical hybrid for coherent communications." Applied Optics, vol. 26, No. 3, Feb. 1987.

Kim., H., et al., "Sub-20-Attosecond Timing Jitter Mode-Locked Fiber Lasers," IEEE Journal of Selected Topics in Quantum Electronics, vol. 20, No. 5, Sep./Oct. 2014.

Kitayama, K, et al., "Ultrafast All-Optical Analog-to-Digital Conversion using Fiber Nonlinearity," ECOC 2009, Sep. 20-24, 2009, Vienna, Austria.

Linde, D., et al., "Characterization of the Noise in Continuously Operating Mode-Locked Lasers," Appl. Phys. B 39, 201-217 (1986).

Luennemann, M., et al., "Electrooptic properties of lithium niobate crystals for extremely high external electric fields," Appl. Phys. B 76, 403-406 (2003).

Miyoshi, Y., et al., "Multiperiod PM-NOLM With Dynamic Counter-Propagating Effects Compensation for 5-Bit All-Optical Analog-to-Digital Conversion and Its Performance Evaluations," Journal of Lightwave Technology, vol. 28, No. 4, Feb. 15, 2010.

Miyoshi, Y., et al., "Performance Evaluation of Resolution-Enhanced ADC Using Optical Multiperiod Transfer Functions of NOLMs," IEEE Journal of Selected Topics in Quantum Electronics, vol. 18, No. 2, Mar./Apr. 2012.

Moazzami, R., et al., "Projecting Gate Oxide Reliability and Optimizing Reliability Screens," IEEE Transactions on Electron Devices. vol. 37. No. 7. Jul. 1990.

Reilly, R., D., et al., "Undersampling a photonic analog-to-digital converter containing an optical hybrid combiner," Optics Communications 288 (2013) 31-37.

Robinson, R., "Polarization modulation and splicing techniques for stressed birefringent fiber," Rochester Institute of Technology RIT Scholar Works, Thesis/Dissertation Collections, Jan. 1995.

Rodwell, W., J., M., et al., "Subpicosecond Laser Timing Stabilization," IEEE Journal of Quantum Electronics, vol. 25, No. 4. Apr. 1989.

Sherman, A., et al., "Optical under-sampling by using a broadband optical comb with a high average power," Optical Society of America, Jun. 2014, vol. 22.

Wei, J., et al., "All-fiber-photonics-based ultralow-noise agile frequency synthesizer for X-band radars," vol. 6, No. 1 / Jan. 2018 / Photonics Research.

(56) References Cited

OTHER PUBLICATIONS

Xiao, J., et al., "High-Frequency Photonic Vector Signal Generation Employing a Single Phase Modulator," IEEE Photonics Journal, vol. 7, No. 2, Apr. 2015.
Xie, X., et al., "Photonic microwave signals with zeptosecond-level absolute timing noise," Nature Photonics, vol. 11, Jan. 2017.
Yao, S., X., et al., "Converting light into spectrally pure microwave oscillation," Optics Letters, vol. 21, No. 7, Apr. 1996.
Yao, S., X., et al., "Optoelectronic Oscillator for Photonic Systems," IEEE Journal of Quantum Electronics, vol. 32, No. 7, Jul. 1996.
Zhou, D., et al., "Single-shotBOTDA based on an optical chirp chain probe wave for distributed ultrafast measurement," Light: Science & Applications (2018) 7:32, Official journal of the CIOMP 2047-7538.
Zou, W., et al., "One-laser-based generation/detection of Brillouin dynamic grating and its application to distributed discrimination of strain and temperature," Optics Express 2363, vol. 19, No. 3, Jan. 2011.
International Searching Authority, International Search Report and Written Opinion, PCT Patent Application PCT/US/2020/042664, dated Oct. 4, 2020, 8 pages.
International Searching Authority, International Search Report and Written Opinion, PCT Patent Application PCT/US2020/042422, dated Nov. 17, 2020, 8 pages.
International Searching Authority, International Search Report and Written Opinion, PCT Patent Application PCT/US2020/042425, dated Nov. 4, 2020, 7 pages.
International Searching Authority, International Search Report and Written Opinion, PCT Patent Application PCT/US2020/045336, dated Mar. 10, 2021, 8 pages.
Chen, Y., K., et al., "Integrated Photonic Digital-to-Analog Converter for Arbitrary Waveform Generation," Bell Laboratories, Alcatel-Lucent, 600 Mountain Avenue, New Jersey, U.S.A., Jun. 2019.
Chen, Ying, et al., "Sub-Nyquist Sampled Analog-to-Digital Conversion Based on Photonic Time Stretch and Compressive Sensing with Optical Random Mixing," Journal of Lightwave Technology vol. 31, No. 21, p. 3395-3401, 2013.
Devore, S., T., P., et al., "Near-field and complex-field time-stretch transform," Proc. of SPIE vol. 9141., Jun. 2020.
Extended European Search Report dated Jul. 10, 2023 for European Patent Application No. 20840963.1.
Extended European Search Report dated Jul. 11, 2023 for European Patent Application No. 20840844.3.
Extended European Search Report dated Jul. 18, 2023 for European Patent Application No. 20844606.2.
Gregers-Hansen, V., et al., "A Stacked A-to-D Converter for Increased Radar Signal Processor Dynamic Range," Radar Division, Naval Research Laboratory Washington, DC 20375, Jun. 2019.
Han, Yan, et al., "Photonic Time-Stretched Analog-to-Digital Converter: Fundamental Concepts and Practical Considerations," Journal of Lightwave Technology, vol. 21, No. 12, 2003, pp. 3085-3103.
Jung, K., et al., "All-fibre photonic signal generator for attosecond timing and ultralow-noise microwave," Scientific Reports, 5:16250, 2015, DOI: 10.1038/srep16250.
Liao, J., et al., "Novel Photonic Radio-frequency Arbitrary Waveform Generation based on Photonic Digital-to-Analog Conversion with Pulse Carving," Department of Electronic Engineering, Tsinghua University, Beijing, I 00084, China, 2015.
Valley, George C., "Photonic analog-to-digital converters," Optics Express vol. 15, No. 5, 2007, pp. 1955-1982.
Xie, Xinggang, et al., "Photonic Time-Stretch Analog-to-Digital Converter Employing Phase-Modulation and Envelope Removing," Proc. of SPIE vol. 9043, 2013.
Extended European Search Report dated Aug. 21, 2023 for European Patent Application No. 20852592.3 (16 pages).
Liang, Yu, et al., "Demonstration of an All-Optical 2-to-4 Level Encoder Based no an Optical Parametric Amplifier," Research Letters in Optics, vol. 2009, 4 pages.
Amir Rashidinejad et al: "Recent Advances in Programmable Photonic-Assisted Ultrabroadband Radio-Frequency Arbitrary Waveform Generation", arxiv.org, Cornell University Library, 201 Olin Library Cornell University Ithaca, NY 14853, Oct. 13, 2015.
Extended European Search Report dated Oct. 5, 2023 for European Patent Application No. 20840956.5 (23 pages).
Kobrinski H et al: "Wavelength-tunable optical filters: applications and technologies", IEEE Communications Magazine, IEEE Service Center, Piscataway, US, vol. 27, No. 10, Oct. 1, 1989 (Oct. 1, 1989), pp. 53-63.
Peng Xiang et al: "Photonic generation of 5,6 BFSK RF signals based on optical pulse shaping", Optoelectronics Letters, Tianjin University of Technology, Heidelberg, vol. 8, No. 5, Sep. 13, 2012 (Sep. 13, 2012), pp. 368-371.
Qian Wang et al: "Optimal design of planar wavelength circuits based on Mach-Zehnder Interferometers and their cascaded forms", Journal of Lightwave Technology, [Online] vol. 23, No. 3, Mar. 1, 2005 (Mar. 1, 2005), pp. 1284-1290.

\* cited by examiner

After calibration

HIGH POWER HANDLING DIGITIZER USING PHOTONICS

CROSS-REFERENCE TO RELATED APPLICATIONS

This patent document is a 371 National Phase Application of International Patent Application No. PCT/US2020/042649, filed Jul. 17, 2020, which claims priority to and benefits of U.S. Provisional Patent Application No. 62/875,861, titled "HIGH POWER HANDLING DIGITIZER USING PHOTONICS," filed on Jul. 18, 2019. The entire contents of the before-mentioned patent applications are incorporated by reference as part of the disclosure of this patent document.

STATEMENT REGARDING FEDERALLY SPONSORED RESEARCH OR DEVELOPMENT

This invention was made with Government support under Contract No. DE-AC52-07NA27344 awarded by the United States Department of Energy. The Government has certain rights in the invention.

TECHNICAL FIELD

This patent document is directed generally to analog-to-digital conversion based on optical techniques.

BACKGROUND

Electronics-based ADCs have relatively low noise and can accept signals with a moderate maximum voltage. This is due to physical damages in Complementary Metal-Oxide Semiconductor (CMOS) transistors caused by strong signals, namely gate oxide breakdown, gate induced drain leakage, and hot electron punch-through. While in some cases it is possible to attenuate strong signals below the ADC threshold, the attenuation can bury weak signal characteristics below the ADC noise floor. It is thus desirable to have an ADC that can simultaneously measure signals in high dynamic range. The disclosed embodiments overcome these shortcomings, and among other features and benefits, enable digitization of high power electronic signals via unlimited optical phase wrapping that uses noise cancellation and calibration algorithms to achieve an extremely large dynamic range.

SUMMARY

The disclosed embodiments relate to devices, methods for analog-to-digital converters (ADCs) that perform high-dynamic range measurements based on optical techniques.

In one example aspect, an optical encoder is disclosed. The optical encoder includes a polarization rotator configured to receive a train of optical pulses and an electro-optic (EO) modulator coupled to an output of the polarization rotator. The EO modulator is configured to receive a radio frequency (RF) signal and to produce a phase modulated signal in accordance with the RF signal. The optical encoder also includes a polarizing beam splitter coupled to the output of the EO modulator and an optical hybrid configured to receive two optical signals from the polarizing beam splitter and to produce four optical outputs that are each phase shifted with respect to one another.

In another example aspect, an optical encoder system is disclosed. The optical encoder system includes a radio frequency (RF) tap for receiving an RF signal to produce a first version of the RF signal and a second version of the RF signal, and an optical four quadrature amplitude modulator (FQAM) configured to receive an optical pulse train and the second version of the RF signal and to produce four optical outputs having phases that are shifted with respect to one another. The four optical outputs enable a determination of a fine phase value associated with the RF signal and a determination of a coarse phase value associated with the RF signal is enabled based on the first version of the RF signal.

In another example aspect, a system for performing analog-to-digital conversion is disclosed. The system includes a radio frequency (RF) tap configured to receive an RF signal to produce a first version of the RF signal and a second version of the RF signal, an optical subsystem configured to receive at least a train of optical pulses and to generate four optical outputs having phases that are shifted with respect to one another, and a digitizer configured to generate five channels of digitized signals based on the first version of the radio-frequency signal and the four optical outputs of the optical subsystem. The five channels of digitized signals enable a determination of a modulated phase value by determining a coarse phase value based on the first version of the RF signal and a fine phase value based on the digitized signals associated with the four optical outputs of the optical subsystem.

In another example aspect, an optical encoding system for an analog-to-digital conversion is disclosed. The optical encoding system includes a tap configured to receive an unattenuated version of a radio-frequency (RF) signal and to produce a weak and a strong copy of the RF signal, an electro-optic (EO) amplitude modulator configured to receive the weak copy of the RF signal and a train of optical pulses to produce an amplitude modulated signal in accordance with the weak copy, and an EO phase modulator configured to receive the train of optical pulses through a polarization rotator. The EO modulator is further configured to receive the strong copy of the RF signal and to produce a phase modulated signal in accordance with the strong copy. The optical encoding system also includes a first optical transmission medium coupled to an output of the EO amplitude modulator to allow transmission of the amplitude modulated signal to a remote location, a second optical transmission medium coupled to an output of the EO phase modulator to allow transmission of the phase modulated signal to the remote location, an integrated optical system residing at the remote location to receive the phase modulated signal and to produce four optical outputs that are each phase shifted with respect to one another, one or more photodetectors to receive the amplitude modulated signal and the four optical outputs of the integrated optical system and to produce electrical signals corresponding thereto, and a digitizer to generate five channels of digitized signals based on the signal received via the first optical transmission medium corresponding to the weak copy of the RF signal and signals associated with the four optical outputs of the integrated optical system. The five channels of digitized signals enable a determination of a modulated phase value by determining a coarse phase value based on the digitized signal corresponding to the weak copy of the RF signal and a fine phase value based on the digitized signals associated with the four optical outputs of the integrated subsystem.

In yet another aspect, an optical encoder system is disclosed. The optical encoder system includes one or more electro-optic modulators configured to receive an RF signal and a train of optical pulses to produce one or more modulated signals in accordance with the RF signal, one or more photodetectors to receive the modulated signals to produce uni-polar electrical signals corresponding thereto, and one or more uni-polar to bi-polar converters configured to receive the unipolar electrical signals and to produce average-level-modified electrical signals to substantially fill a full-scale of subsequent digitizers.

These, and other, aspects are described in the present document.

DETAILED DESCRIPTION

Typical electronic ADCs (eADCs) have a full scale of only a few volts. Strong signals that are above this limit can potentially destroy the ADC. To achieve a high dynamic range ADC, multiple low-noise low-range ADCs can be stacked or multiplexed to form a single high dynamic range receiver. However, these devices must digitally stitch multiple independent high-fidelity measurements together, which leads to calibration errors such as harmonics and spurs. These calibration issues limit performance of the overall recording system, especially dynamic range requirements increase. Therefore, it is desirable to record the entire voltage range on a single measurement device, which both has low noise and can accept very large signal power.

Photonic ADC (pADC) devices use an electro-optic modulator (EOM) to encode electronic information onto the phase of an optical signal and can accept very large electronic signals. However, optical phase cannot be measured directly and requires mixing with a coherent reference to extract the phase information, making the system more complex. Phase-encoded pADC systems have been used to increase the maximum input voltage of a pADC to 7C radians. However, several limitations prevent further improvement. First, optical phase is inherently ambiguous. Furthermore, an eADC is still required for digitization of the I/Q channels, which limits full scale even further. Finally, noise introduced by the optical signal itself is typically higher than electronic noise, thus decreasing the dynamic range.

Figure 1:
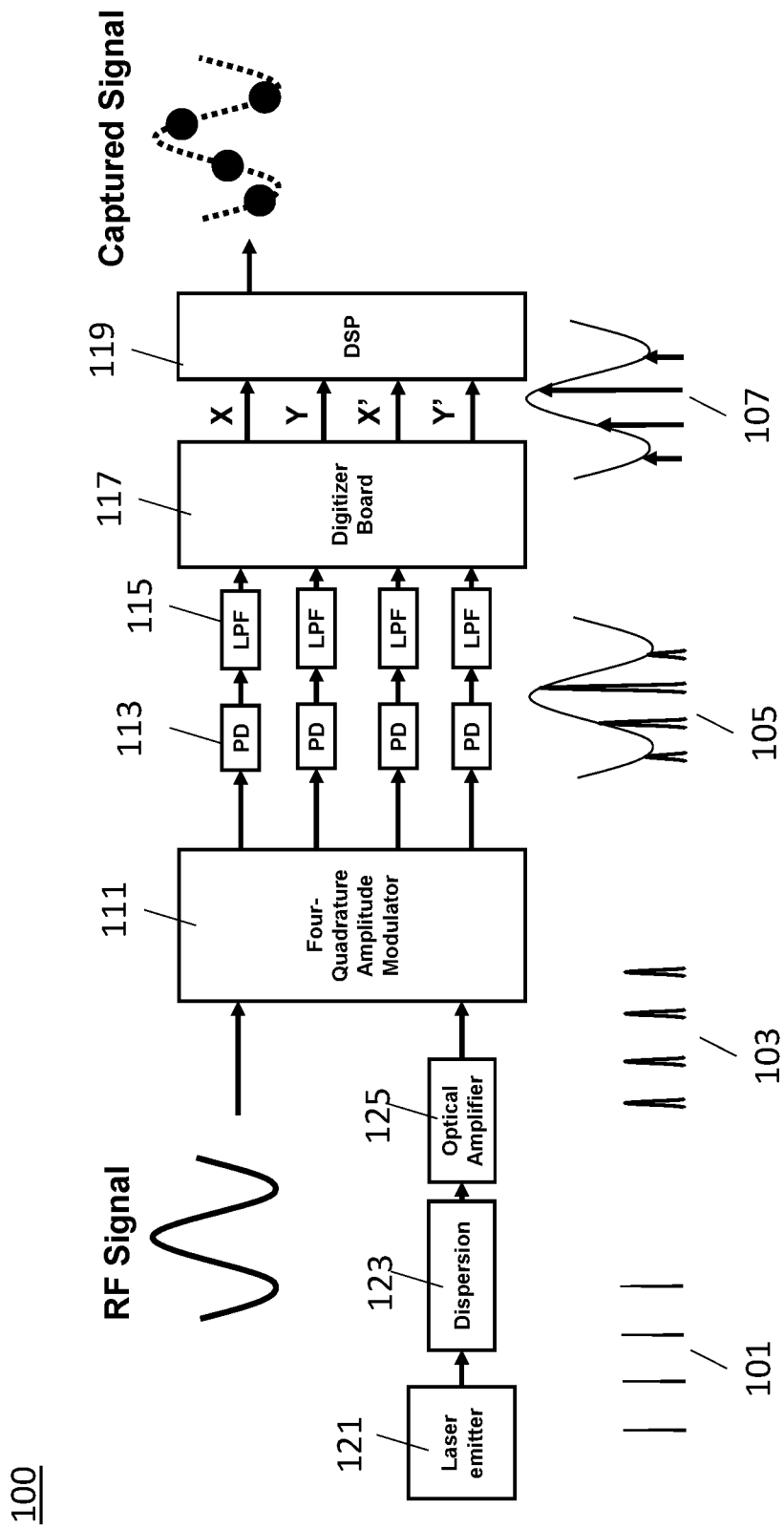
FIG. 1 illustrates an example architecture of a photonic Analog-to-Digital Converter (ADC) in accordance with the present technology.

Techniques disclosed herein address these and other limitations to enable a phase-encoded pADC with a high dynamic range. FIG. 1 illustrates an example architecture of a pADC 100 in accordance with the present technology. The pADC 100 includes an optical noise-canceling encoder 111 that takes a radio-frequency (RF) signal and an optical pulse stream 101 as inputs. For example, the optical pulse stream 101 can be generated by an optical pulse source 121, such as a laser. In some embodiments, the optical pulse stream 101 can go through a dispersion element 123 and/or an optical amplifier 125 to obtain a dispersed and/or amplified optical pulse stream 103 to improve encoding and detection. The dispersion element 123 operates to spread the spectral contents of the optical pulses in time. The four-quadrature amplitude modulator 111 produces four optical pulse outputs whose phases are mutually shifted 90 degrees from one another. Each of the resulting optical pulses 105 has information encoded therein based on the RF signal. Each of the output pulses is then provided to a photodetector (PD) 113 and is converted into an electrical signal. The electrical signal can optionally be subject to filtering (e.g., via a low-pass filter (LPF) 115) before being directed to a digitizer. The digitizer 117 then digitizes all electrical signals 105 into digital signals 107. A digital signal processing (DSP) unit 119 can reconstruct a high-resolution estimate of the original input voltage using the digital signals from the digitizer.

Figure 2:
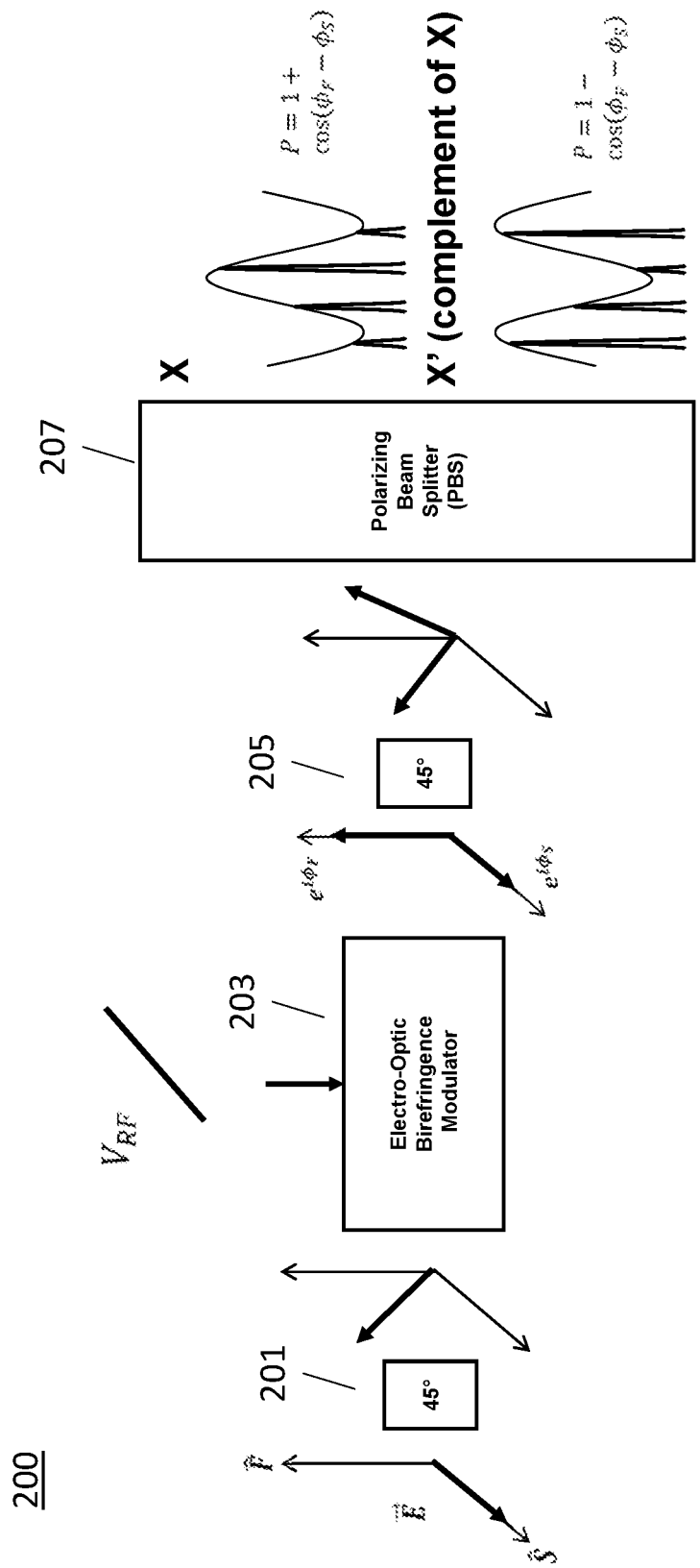
FIG. 2 illustrates an example embodiment of an electro-optical encoder in accordance with the present technology.

FIG. 2 illustrates an example embodiment of an electro-optical encoder 200 in accordance with the present technology. The encoder 200 is one example implementation of the electro-optical noise-canceling encoder 111 shown in FIG. 1. In this example, the encoder 200 is implemented using a single optical fiber that provides a common path for polarized beams (e.g., two arms of the interferometer) that can travel in opposite directions. The single fiber-optic component includes a reversed fiber optic polarizing beam splitter or a 45-degree splice 201. For example, a "style 2" fiber optic polarizing beam splitter is a device that has a slow axis aligned 45 degrees to port 1 and a port configuration of 1×2. When the light is sent into the slow axis from port 2 or 3, the light is coupled half into each polarization of port 1, thus functioning the same as how a 45-degree splice sends linearly polarized light half into each polarization after the splice.

The output from the splice is then sent to an electro-optic birefringence polarization modulator 203. The birefringence polarization modulator 203 is a device that alters the total birefringence of the device linearly proportional to the voltage applied. Examples of polarization modulators include lithium niobate phase modulators and GaAs phase modulators. A voltage applied to the polarization modulator alters the phase of the two arms of this interferometer, the two arms being the two polarizations between another 45-degree splice or "style 2" polarizing beam splitter 205, all the way to the two outputs of the polarizing beam splitter 207.

The transfer function can be defined as follows:

$$|\varphi_F - \varphi_S| = \left|\frac{\pi V_{RF}}{2V_{\pi,F}} - \frac{\pi V_{RF}}{2V_{\pi,S}}\right| = \frac{\pi V_{RF}}{2V_{\pi,bi}} \qquad \text{Eq. (1)}$$

Here, $$\frac{1}{V_{\pi,bi}} = \left|\frac{1}{V_{\pi,F}} - \frac{1}{V_{\pi,S}}\right|$$

for birefringence. $V_\pi$ is the characteristic voltage of the modulator required to induce a phase shift based on material property, geometry, and other factors. As shown in FIG. 2, the interference effect is associated with the transfer function, which is similar to a Mach-Zehnder interferometer. However, unlike a conventional fiber Mach-Zehnder interferometer, in which the light propagates in two independent arms (e.g., two fibers), the configuration shown in FIG. 2 separates interferometric device from modulator using a single fiber path. Thus, instability and noise in different fibers caused by environmental fluctuation (e.g., temperature, vibrations, etc.) can be reduced or eliminated.

Figure 3:
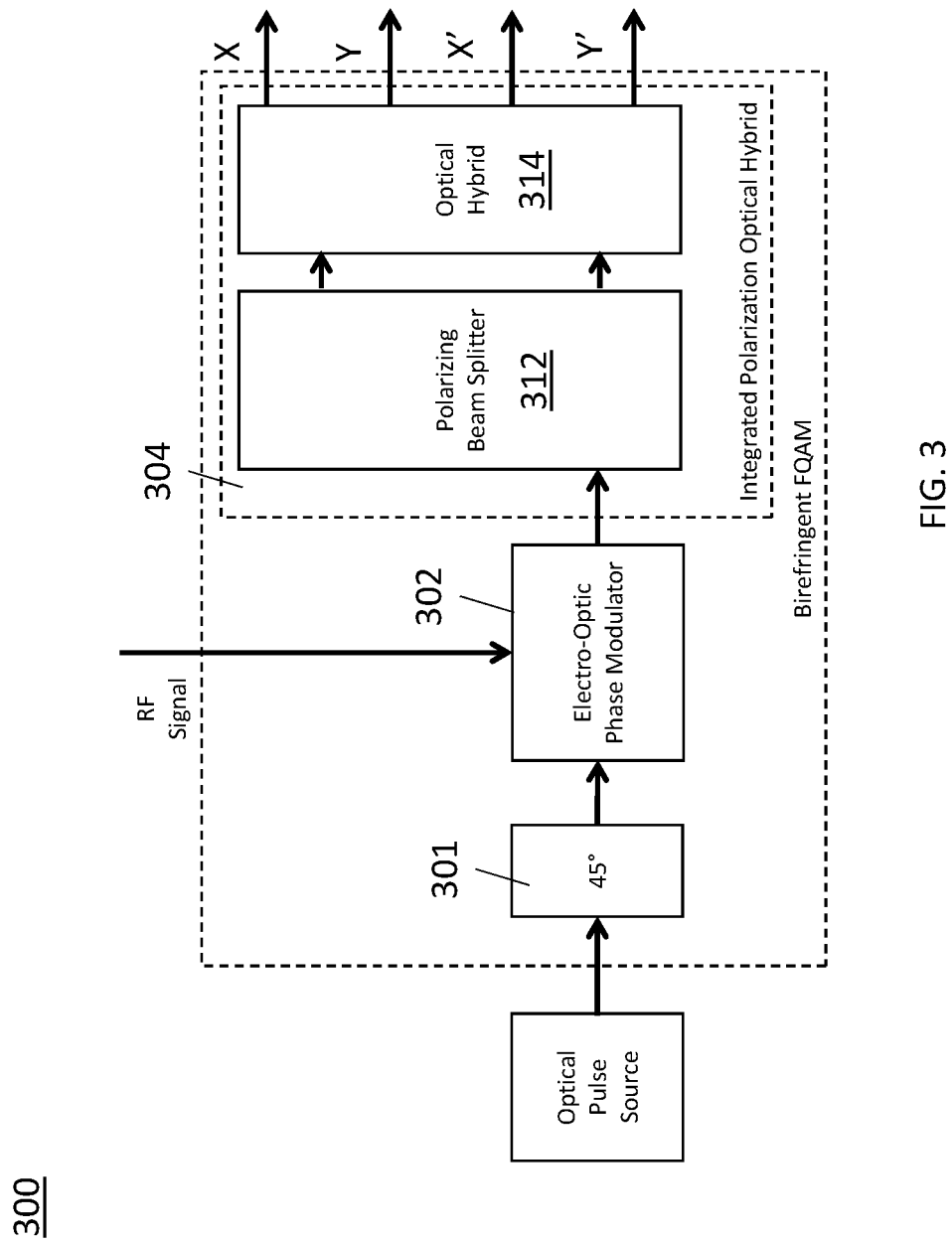
FIG. 3 illustrates an example embodiment of an electro-optical noise-canceling encoder in accordance with the present technology.

FIG. 3 illustrates an example embodiment of an electro-optical noise-canceling encoder 300 in accordance with the present technology. In this example, the encoder 300 includes a reversed fiber optic polarizing beam splitter or a 45-degree splice 301. The output from the reversed fiber optic polarizing beam splitter or the 45-degree splice 301 is directed to an electro-optic phase modulator 302. The modulator 302 also takes an RF signal as an input. The light from the phase modulator 302 is directed to an integrated component 304 that includes a polarization beam splitter 312 and an optical hybrid 314. The optical hybrid 314 is a device that can include a number of beam splitters and one or more quarter-wave plates to make copies of the two inputs and create two interferometers, accordingly. By adjusting the phase between the two inputs, the optical hybrid 314 can obtain four outputs X, Y, X' and Y' whose phases are mutually shifted from each other (such as $P_0°$, $P_{90}°$, $P_{180}°$, and $P_{270}°$). The X, Y, X' and Y' can be used to determine the phase the optical signal.

Figure 4:
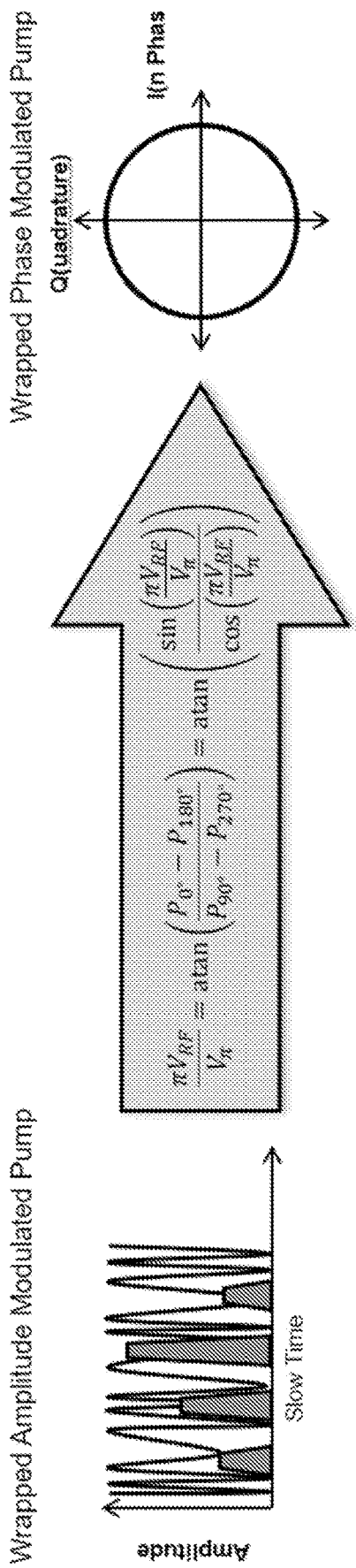
FIG. 4 illustrates an example of converting a sinusoidal transfer function to a wrapped phase signal in accordance with the present technology.

For instance, FIG. 4 illustrates an example for converting a sinusoidal transfer function to a wrapped phase signal. The modulated wrapped phase can be obtained by:

$$\frac{\pi V_{RF}}{V_\pi} = \operatorname{atan}\left(\frac{P_{0°} - P_{180°}}{P_{90°} - P_{270°}}\right) = \operatorname{atan}\left(\frac{\sin\left(\frac{\pi V_{RF}}{V_\pi}\right)}{\cos\left(\frac{\pi V_{RF}}{V_\pi}\right)}\right) \qquad \text{Eq. (2)}$$

Figure 5:
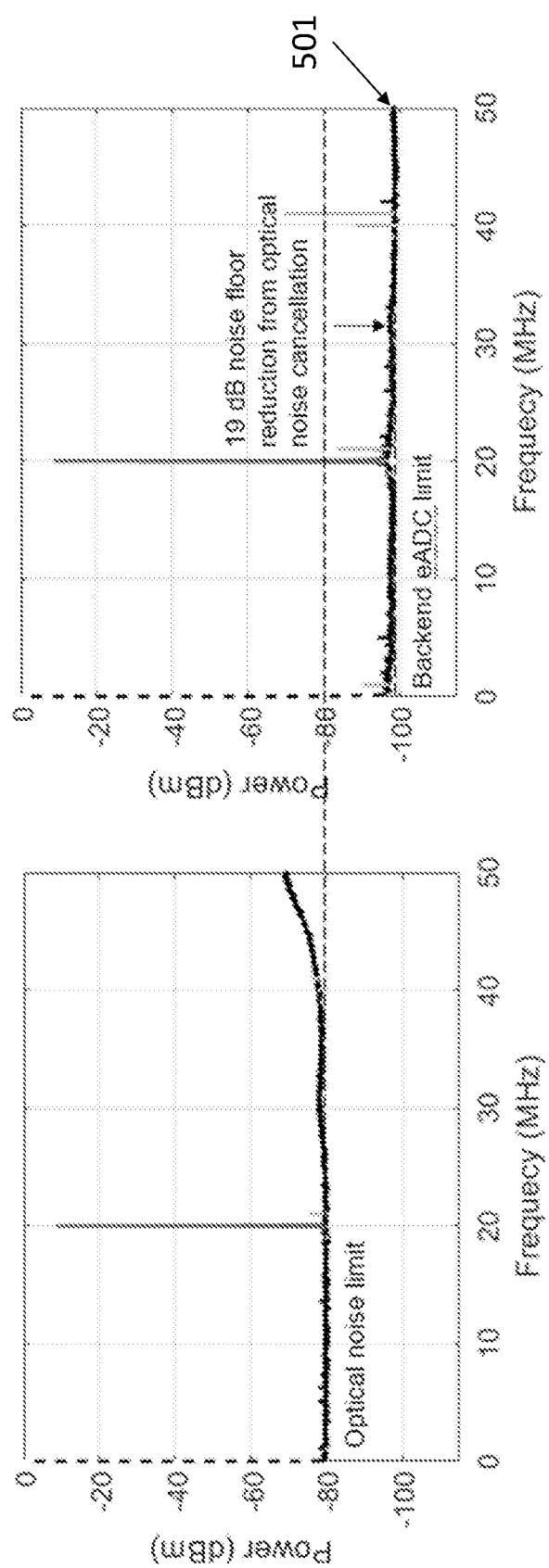
FIG. 5 illustrates an example plot of a low noise floor and a high signal ceiling of signal power in accordance with the present technology.

Using a conventional amplitude modulator (e.g., Mach-Zehnder modulator), two output beams, e.g., 0° and 90° beams, can be used to perform an arctan operation for reconstructing the phase information. When the quadrature components are missing during modulation, noise can be easily amplified due to the loss of sensitivity because the arctan operation (which becomes an arcsine function) has an infinite slope as the function approaches the boundaries. However, when input data is present in both in-phase and quadrature, in-phase and quadrature act complimentary to each other, thereby allowing effective reconstruction of the wrapped phase information. Using additional streams of input data (e.g., 90° and 270°), common noise that is applicable to all channels can be removed (canceled out) from the numerator and the denominator of Equation (2) before the division operation as shown in Eq. (2). Similarly, by taking the difference between the 0 and 180 and the difference between the 90 and 270 pulses before dividing, any common optical noise on all 4 pulse streams will be cancelled, reducing system noise floor and increasing dynamic range. The encoder 300 as shown in FIG. 3 is thus capable of canceling the common noise applicable to all streams. As shown in FIG. 5, canceling the common optical noise is one of the key steps in the ADC process to ensure a low noise floor 501 and a high signal ceiling for the high dynamic range of signals.

Figure 6:
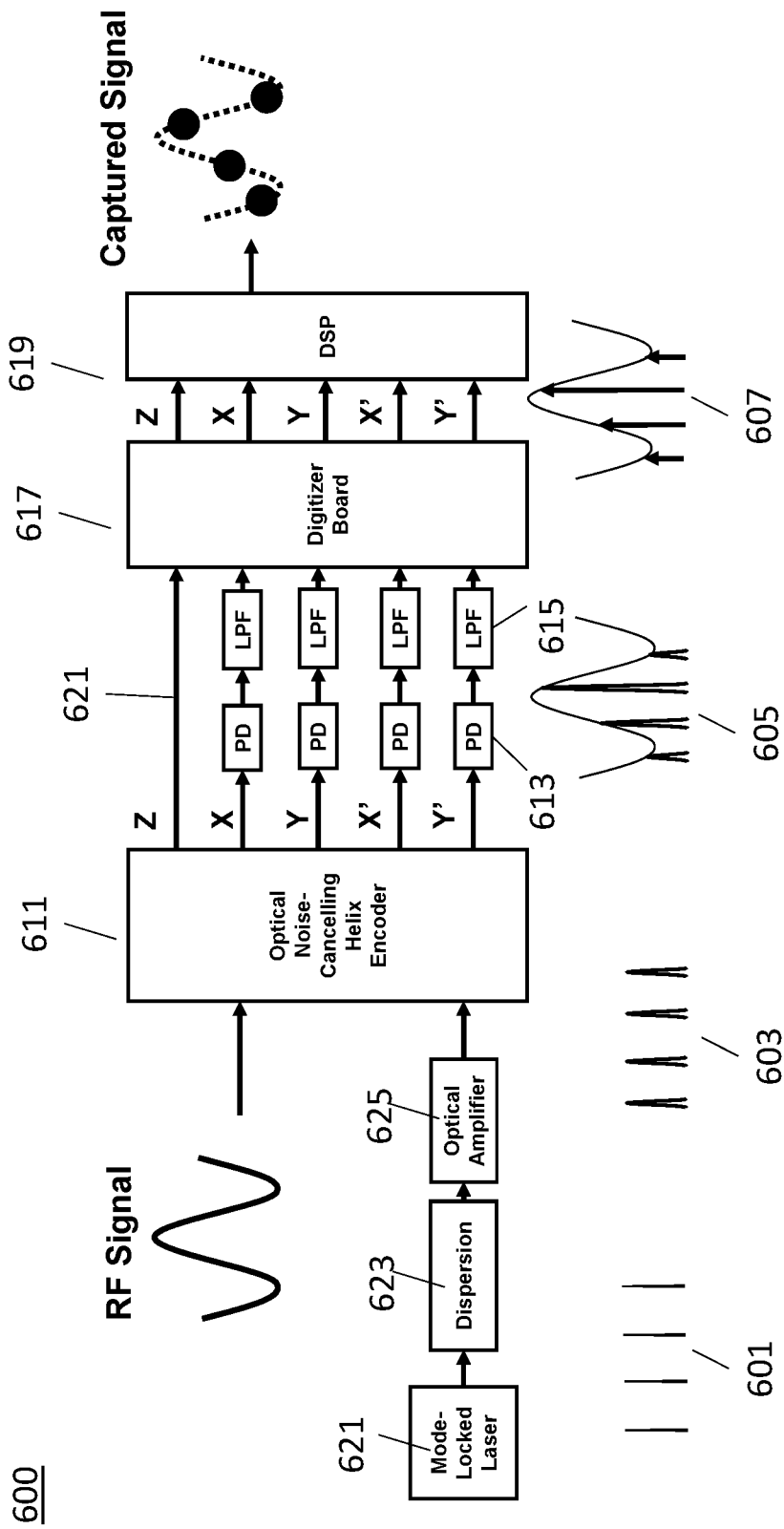
FIG. 6 illustrates another example architecture of a pADC in accordance with the present technology.

FIG. 6 illustrates another example architecture of a pADC 600 in accordance with the present technology. The pADC 600 includes an electro-optical noise-canceling encoder 611 that receives an RF signal and a series of optical pulses 601 as inputs. For example, the optical pulses 601 can be generated by an optical pulse source 621, such as a laser emitter. In some embodiments, the optical pulses 601 can be provided to a dispersion element 623 and/or an optical amplifier 625 to obtain a series of dispersed and/or amplified optical pulse 603 for easier detection.

In this embodiment, the electro-optical noise-canceling encoder 611 produces a weak version of the RF signal in a separate channel, Z, 621. The weak RF signal can be produced by sending the original RF signal to a coupler that produces a copy of the RF signal with reduced power. Due to the fact that optical phase is inherently ambiguous, the weak RF signal can be used as a coarse phase indicator to facilitate phase unwrapping. The electro-optical noise-canceling encoder 611 also produces four output optical signals whose phases are mutually shifted, e.g., by 90 degrees, from one another. Each of the resulting optical pulses 605 encodes information from the original RF signal and are provided to a photodetector (PD) 613 for conversion into an electrical signal. The electrical signal can optionally be subjected to a filtering operation (e.g., via LPF 615) before being processed by a digitizer. The digitizer 617 then digitizes the electrical signals into digital signals 607. A digital signal processing unit 619 receives all five digital streams and reconstructs a high-resolution estimate of the original input RF signal using the digital signals 607 from the digitizer 617.

Figure 7A:
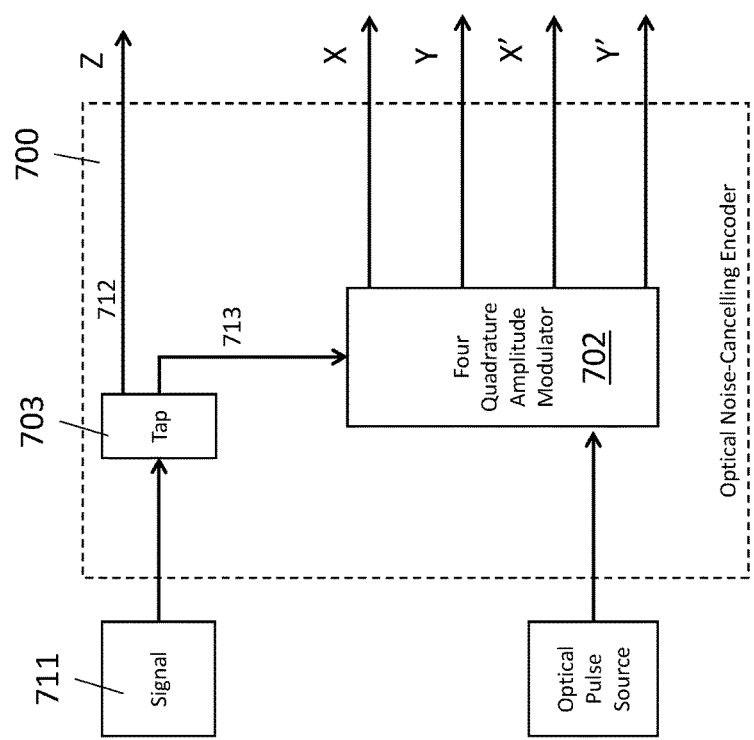
FIG. 7A illustrates an example embodiment of an electro-optical noise-canceling encoder in accordance with the present technology.

FIG. 7A illustrates an example embodiment of an electro-optical noise-canceling encoder 700 in accordance with the present technology. In this embodiment, the encoder 700 can include an integrated Four Quadrature Amplitude Modulator (FQAM) 702. An RF input 711 is directed to an electric tap 703 (also known as a tap conductor) so that a small amount of the RF signal is used to create a weak RF signal 702 while the majority of the RF signal 703 is directed to the FQAM 702. For example, more than 50% of the RF signal can be directed to the FQAM 702. The weak RF signal 712 is directed to an electro-optic amplitude modulator 714 to facilitate the unwrapping of the modulated phase. The FQAM 712 may include a polarizing beam splitter and an optical hybrid to generated four phase-shifted outputs X, Y, X' and Y'. All five channels of outputs can then be provided to the photodetector and ultimately the DSP unit for subsequent processing (see, e.g., FIG. 6).

Figure 7B:
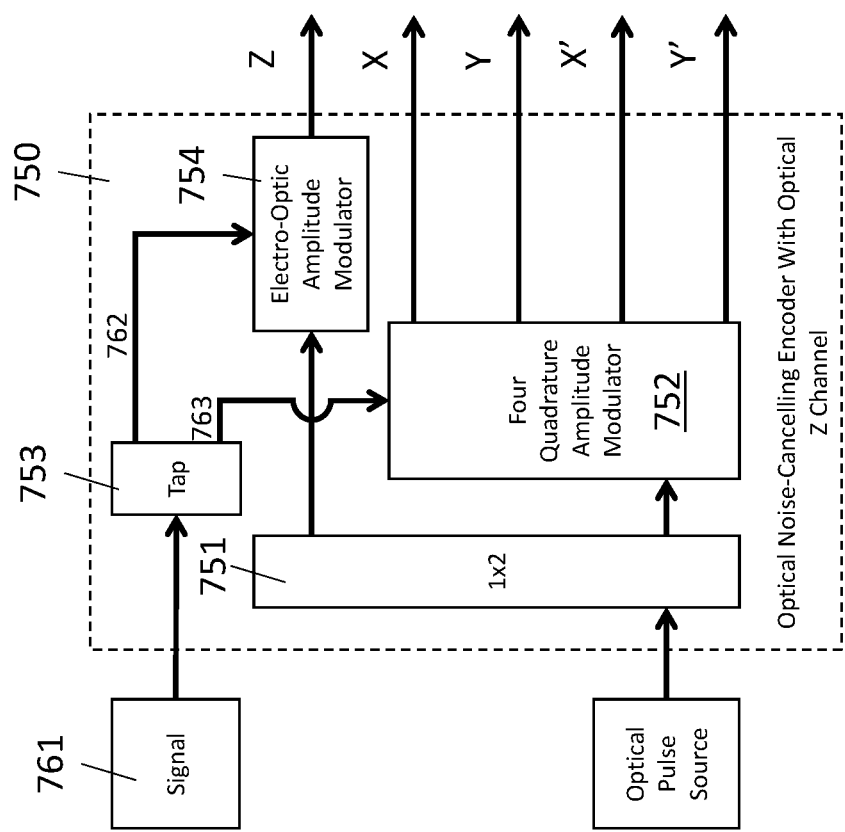
FIG. 7B illustrates another example embodiment of an electro-optical noise-canceling encoder in accordance with the present technology.

FIG. 7B illustrates another example embodiment of an electro-optical noise-canceling encoder 750 in accordance with the present technology. In this embodiment, the encoder 750 can include a reversed fiber optic polarizing beam splitter or a 45-degree splice 751. The output from the reversed fiber optic polarizing beam splitter or the 45-degree splice 751 is directed to an integrated Four Quadrature Amplitude Modulator (FQAM) 752. An RF input 761 is directed to an electric tap 753 so that a small amount of the RF signal is used to create a weak RF signal 762 while the majority of the RF signal 763 is directed to the FQAM 752. For example, more than 50% of the RF signal can be directed to the FQAM 752. The weak RF signal 762 is directed to an electro-optic amplitude modulator 754 to facilitate the unwrapping of the modulated phase. The FQAM 752 may include a polarizing beam splitter and an optical hybrid to generated four phase-shifted outputs X, Y, X' and Y'. All five channels of outputs can then be provided to the photodetector and ultimately the DSP unit for subsequent processing (see, e.g., FIG. 6).

Figure 8:
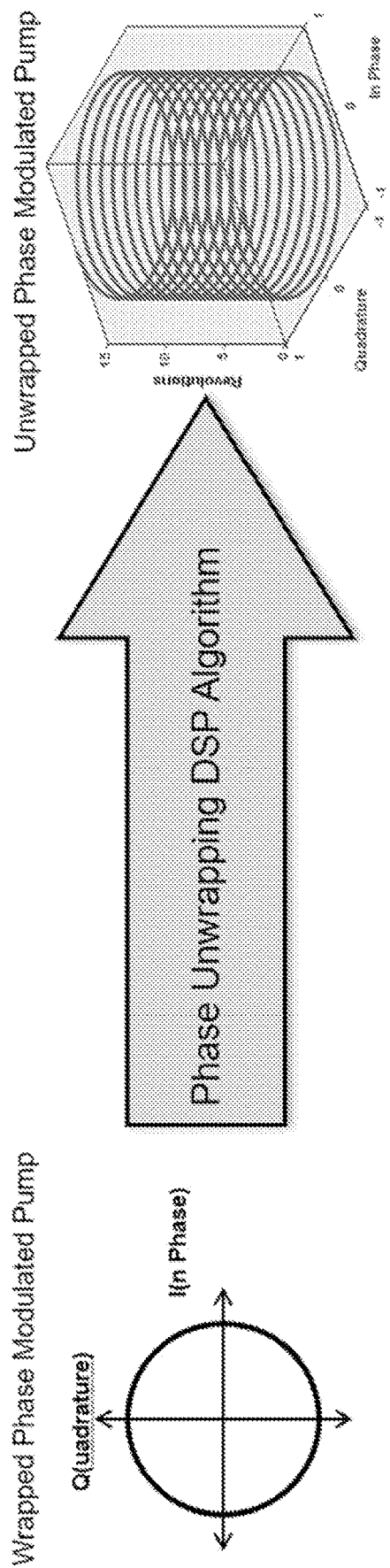
FIG. 8 illustrates an example reconstruction of an unwrapped phase signal in a shape in accordance with the present technology.

FIG. 8 provides an illustration to facilitate the understanding of phase unwrapping. The left-hand side illustrates a two-dimensional view of the in-phase and quadrature components, which only allows the determination of the phase value within a (or one unit circle). The right-hand side of FIG. 8 illustrates the accumulated phase as it exceeds 2n; after accumulation of each 2n, the helix moves to the (higher) level. The task of phase unwarping can thus be narrowed down to determining a coarse value (e.g., the level of the helix) and fine value (e.g., the location within a given helix). Therefore, the exact phase can be determined given the de-noised high-precision input from the four phase-shifted channels and the coarse RF signal in the unwrapping channel.

Figure 9:
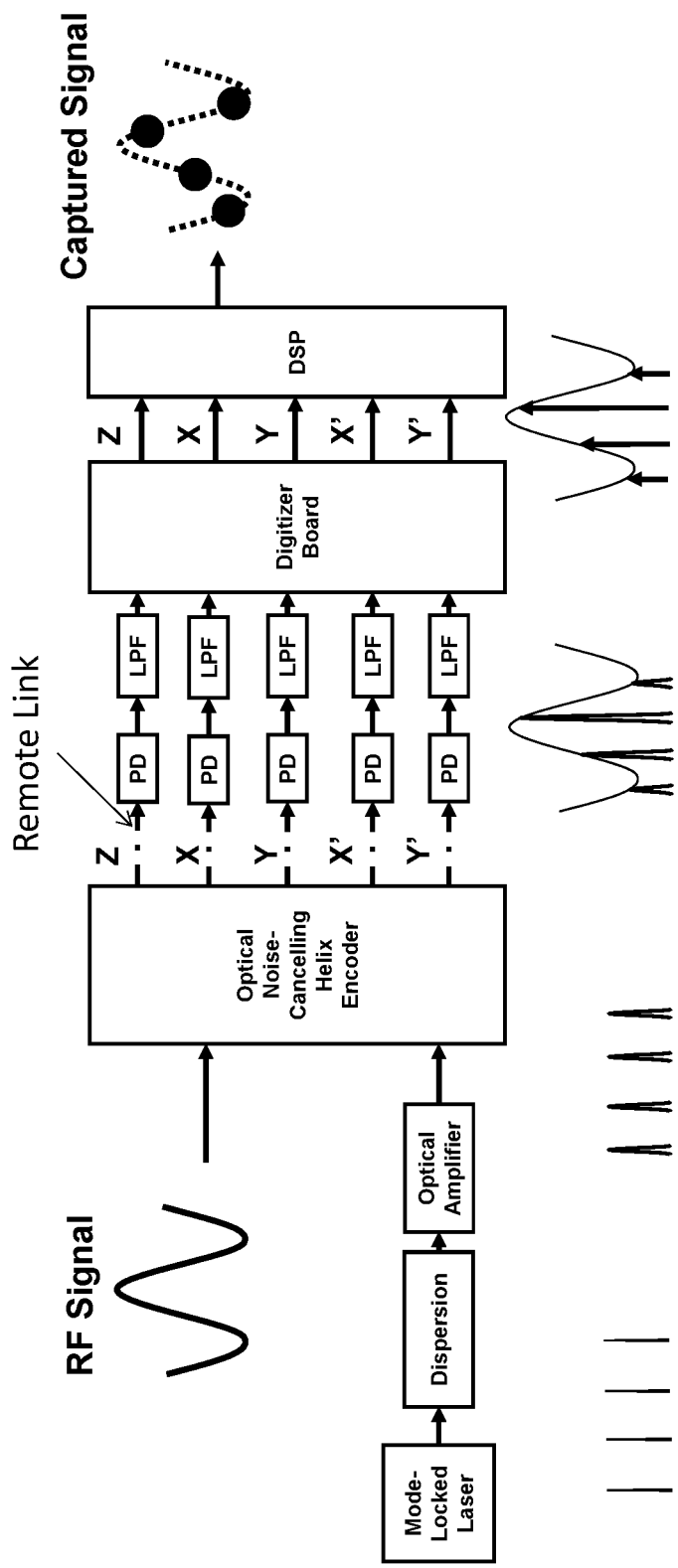
FIG. 9 illustrates another example embodiment of an electro-optical noise-canceling encoder in accordance with the present technology.

FIG. 9 illustrates another example embodiment of an electro-optical noise-canceling encoder 900 in accordance with the present technology. In this embodiment, a weak copy of the RF signal is converted to the optical domain so that the signal can be reliably transmitted over a long distance. The resulting Z channel output can be optically transmitted via a remote link (e.g., a fiber) before reaching a PD on the receiving side and optionally go through a corresponding LPF before being directed to the digitizer. Similarly, each of the X, X', Y and Y' optical signals can be transmitted over optical channels to the remote location. Similar to the example shown in FIG. 8, the optical signal in the unwrapping channel Z can be used to determine the exact phase of the input.

Figure 10:
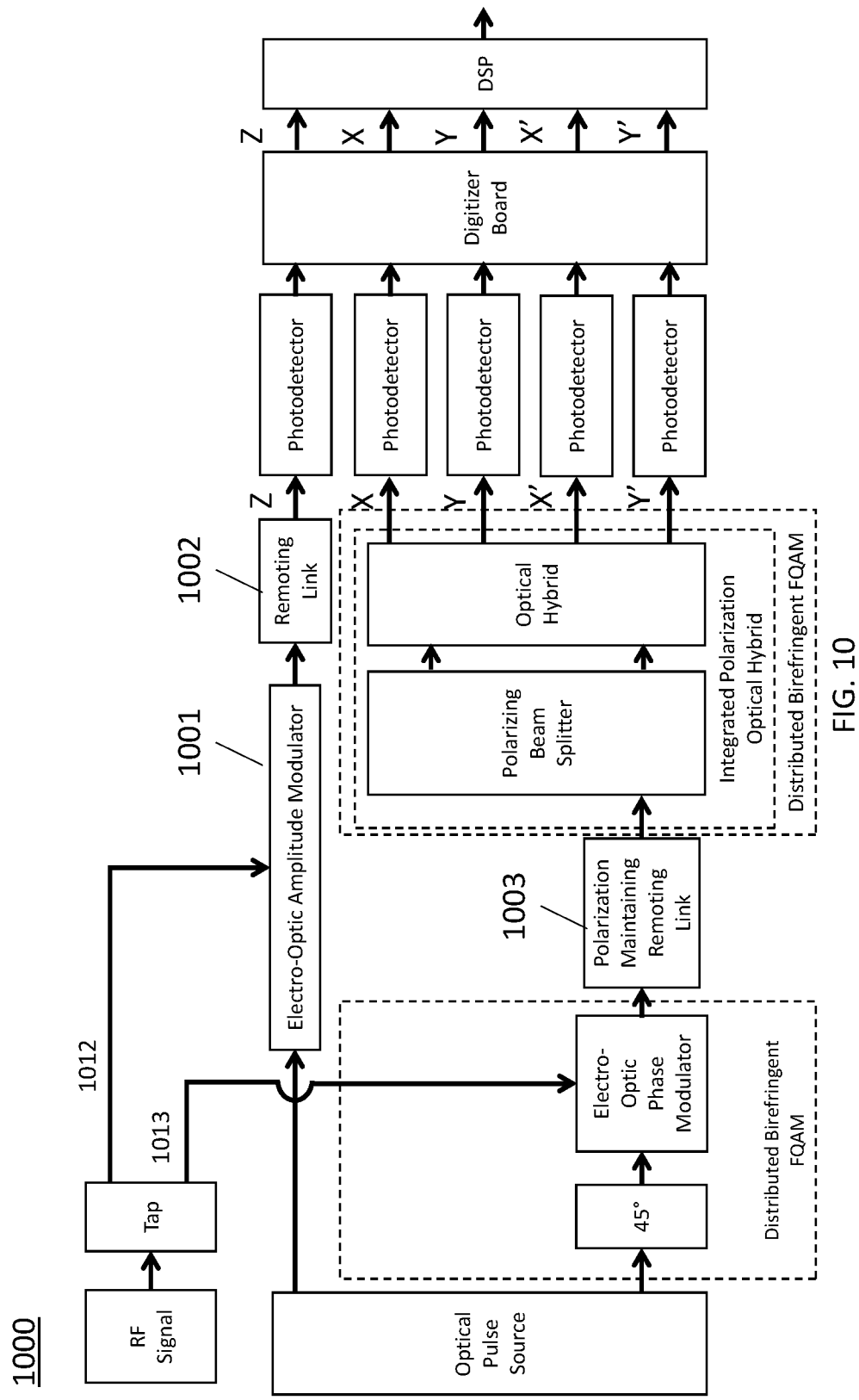
FIG. 10 illustrates another example embodiment of an electro-optical noise-canceling encoder in accordance with the present technology.

FIG. 10 illustrates another example embodiment of an electro-optical noise-canceling encoder 1000 in accordance with the present technology. This embodiment describes another remoting configuration of the encoder 1000 that requires two remote links only. In this embodiment, the RF signal and the optical pulse source are positioned at a long distance from the photodetectors. To ensure reliable transmissions of the signals, the weak RF signal 1012 is converted into the optical domain using an electro-optic amplitude modulator 1001 before being transmitted via a remote link 1002. A birefringent FQAM in this embodiment adopts a distributed design, with two parts that are connected via a polarization maintaining remote link 1003. The input optical pulse from the pulse source is provided to a first part of the birefringent FQAM, which includes either a reversed fiber optic polarizing beam splitter or a 45-degree splice as well as an electro-optic phase modulator. The output from the phase modulator is provided to a single fiber link which optically transmits the signal to the integrated polarization optical hybrid that includes the second part of the birefringent FQAM. The integrated polarization optical hybrid can include a polarizing beam splitter and an optical hybrid. The use of the single polarization maintaining link results in improved stability over a two-fiber fiber-optic interferometer. The integrated polarization optical hybrid then produces the four phase-shifted outputs X, Y, X' and Y' that can be provided to the DSP unit after photodetection, filtering and analog-to-digital conversion to reconstruct phase information based on all five channels.

Figure 11:
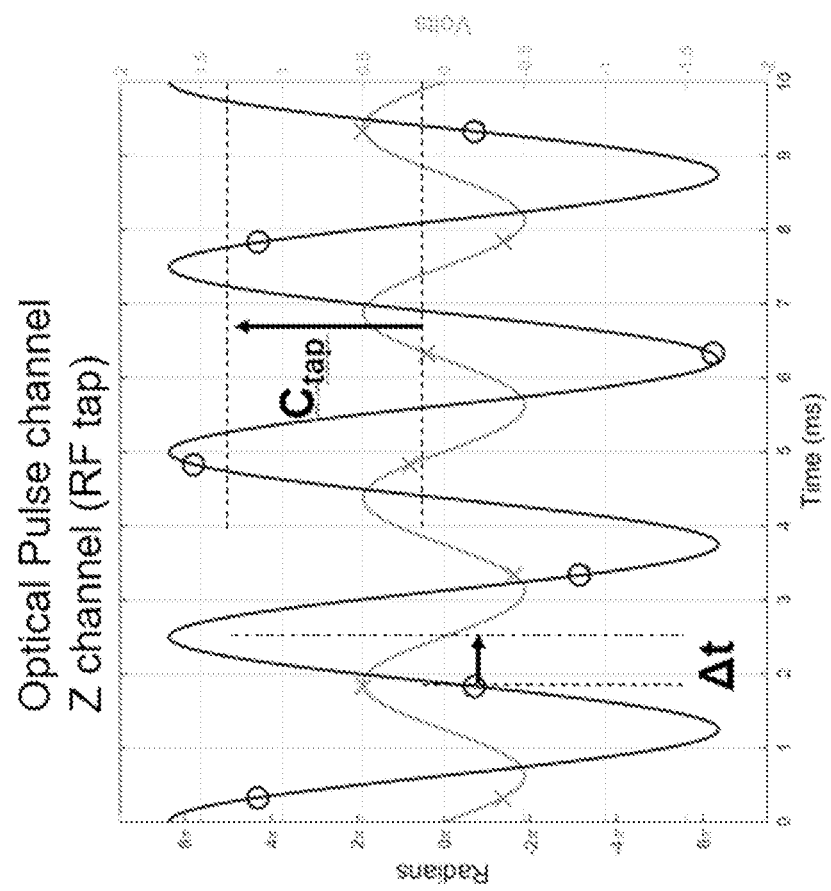
FIG. 11 illustrates an example calibration step to align an unwrapping channel with the rest of the output streams in accordance with the present technology.

FIG. 11 illustrates an example calibration step 1100 to align an unwrapping channel to facilitate phase unwrapping in accordance with the present technology. For example, in a remoting configuration, the weak noisy signal in the Z channel (marked as "x") may be shifted by parameter $\Delta t$ in the time domain as compared to the strong optical channel(s) (marked as "o"). Parameter $C_{tap}$ incorporates $V_\pi$ of the electro-optic modulator and attenuation of the Z channel. Both parameters can be measured by comparing fit parameters of the sinusoidal input.

Figure 12:
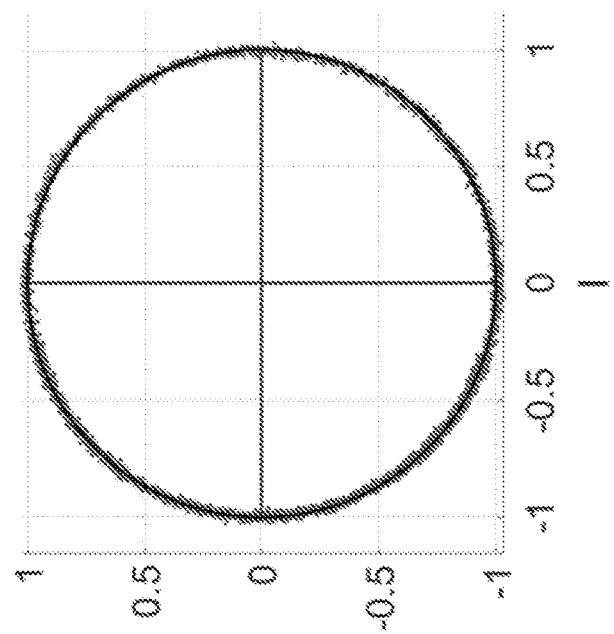
FIG. 12 illustrates another example calibration step in accordance with the present technology.
Figure 12:
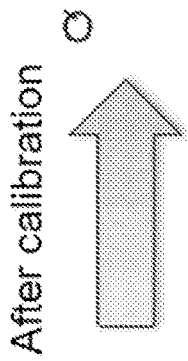
Figure 12:
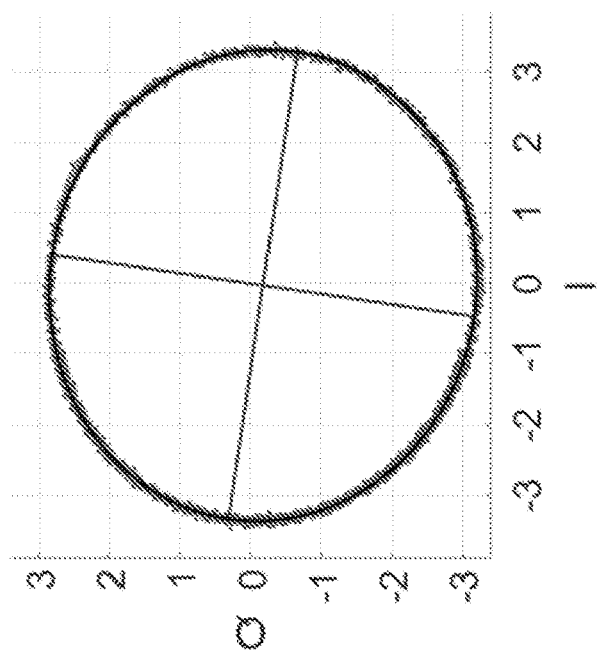

FIG. 12 illustrates another example calibration step 1200 in accordance with the present technology. Ideally, the 0° and 90° pulses (as well as the 180° and 270° pulses) are proportional to the sine and cosine of the modulated phase at the time of sampling. Thus, when plotted on the axes of a graph, the 0° and 90° pulses (similarly, the 180° and 270° pulses) from all possible modulated phases should form a circle. Any deviation from a true circle is a result of distortion in the system. To remove such distortions, the received data can be sampled according to all possible modulated phases to fit to an ellipse. The ellipse fit estimates several parameters: x-y center location, x-y axis length, and tilt. Once an ellipse is obtained, corrections can be applied to the data to correct it back into a circle. This procedure removes biases and/or offsets in the components such as the modulators, filters, digitizers, etc.

Figure 13:
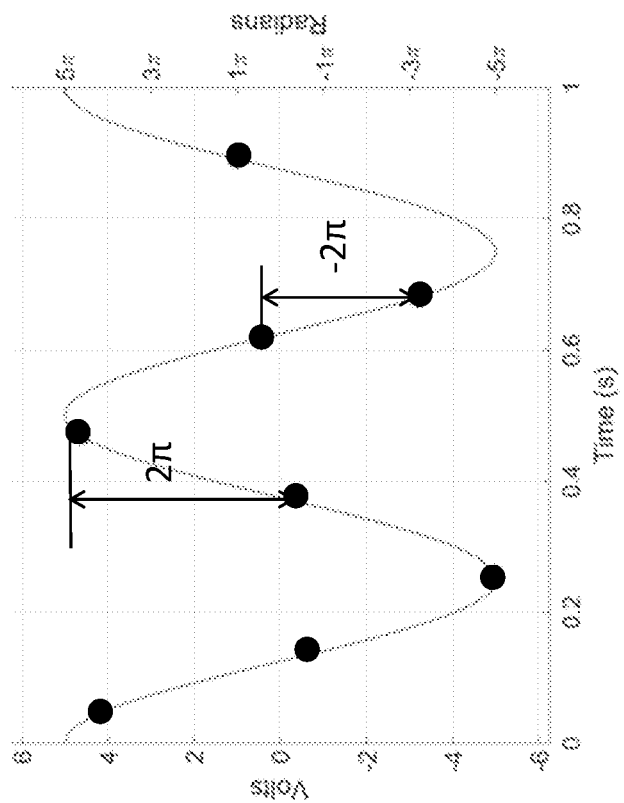
FIG. 13 illustrates an example method of unwrapping the phase information in accordance with the present technology.

After the calibration step(s), each sample of the wrapped channel measurement can be unwrapped by a multiple of a to obtain a value that is proportional to the input electronic signal. Several methods can be used to perform the unwrapping. FIG. 13 illustrates an example method 1300 of unwrapping the phase information in accordance with the present technology. This method assumes that the RF signal is a slow varying electrical signal that does not vary more than $V_\pi$ volts per sample. With this assumption, no additional information is needed to perform the unwrapping operation, making this method suitable for configurations such as shown in FIG. 1 and FIG. 3 that do not require the Z channel. As shown in FIG. 13, any discrete, sample-to-sample jumps of greater than $\pi$ in the ambiguous signal are assumed to be off by exactly a if the jump is positive, or $-2\pi$ if the jump is negative. Thus, the entire signal can be unwrapped point-by-point sequentially.

Figure 14:
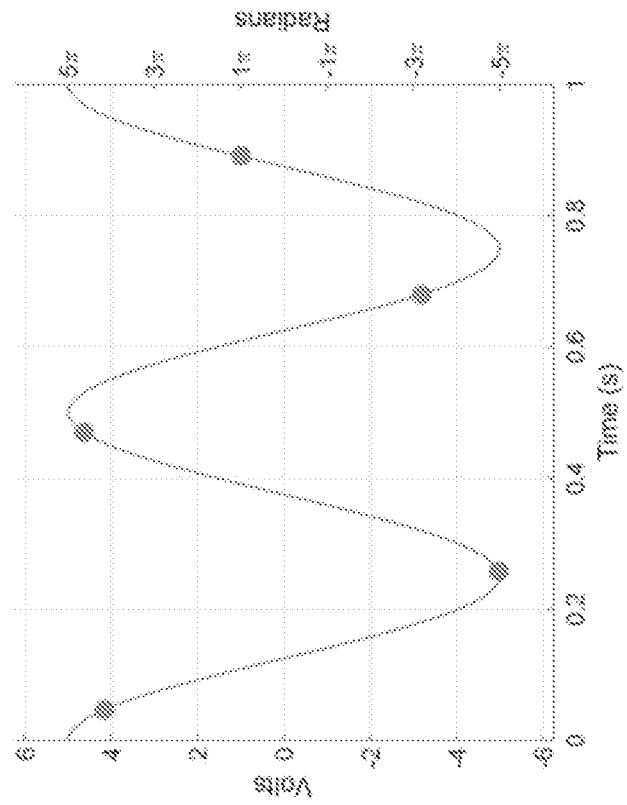
FIG. 14 illustrates another example method of unwrapping the phase information in accordance with the present technology.
Figure 14:
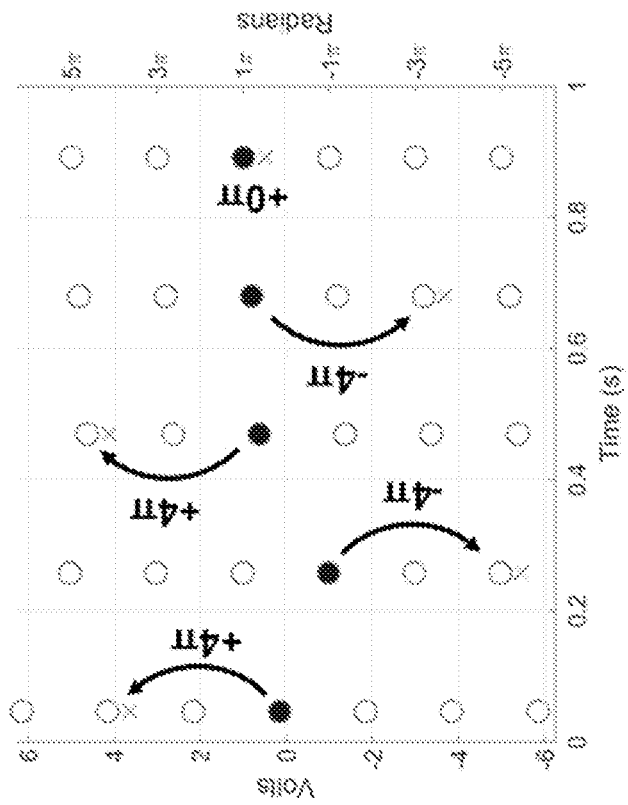

FIG. 14 illustrates another example method 1400 of unwrapping the phase information in accordance with the present technology. This method does not make any assumption about the RF signal and requires a coarse signal (e.g., the unwrapping channel Z) to determine the exact phase value, making it suitable for configurations such as shown in FIG. 6, FIG. 7, FIG. 9 and FIG. 10. First, the unwrapping channel (signals from Z channel) is converted from units of volts (left vertical axis) to radians (right vertical axis). The wrapped channels (signals from X, X', Y, Y' channels) can be corrected to match the mean of the unwrapping channel. The difference between the two measurements is rounded to the nearest a and added onto the wrapped channel to produce the unwrapped estimate. To ensure no errors occur in the unwrapping, the unwrapping channel cannot have a sampling error greater than π radians, or Vπ volts. Because electro-optical modulator Vπ values are generally around 1 to 4 V, so this is easily achievable.

Figure 15A:
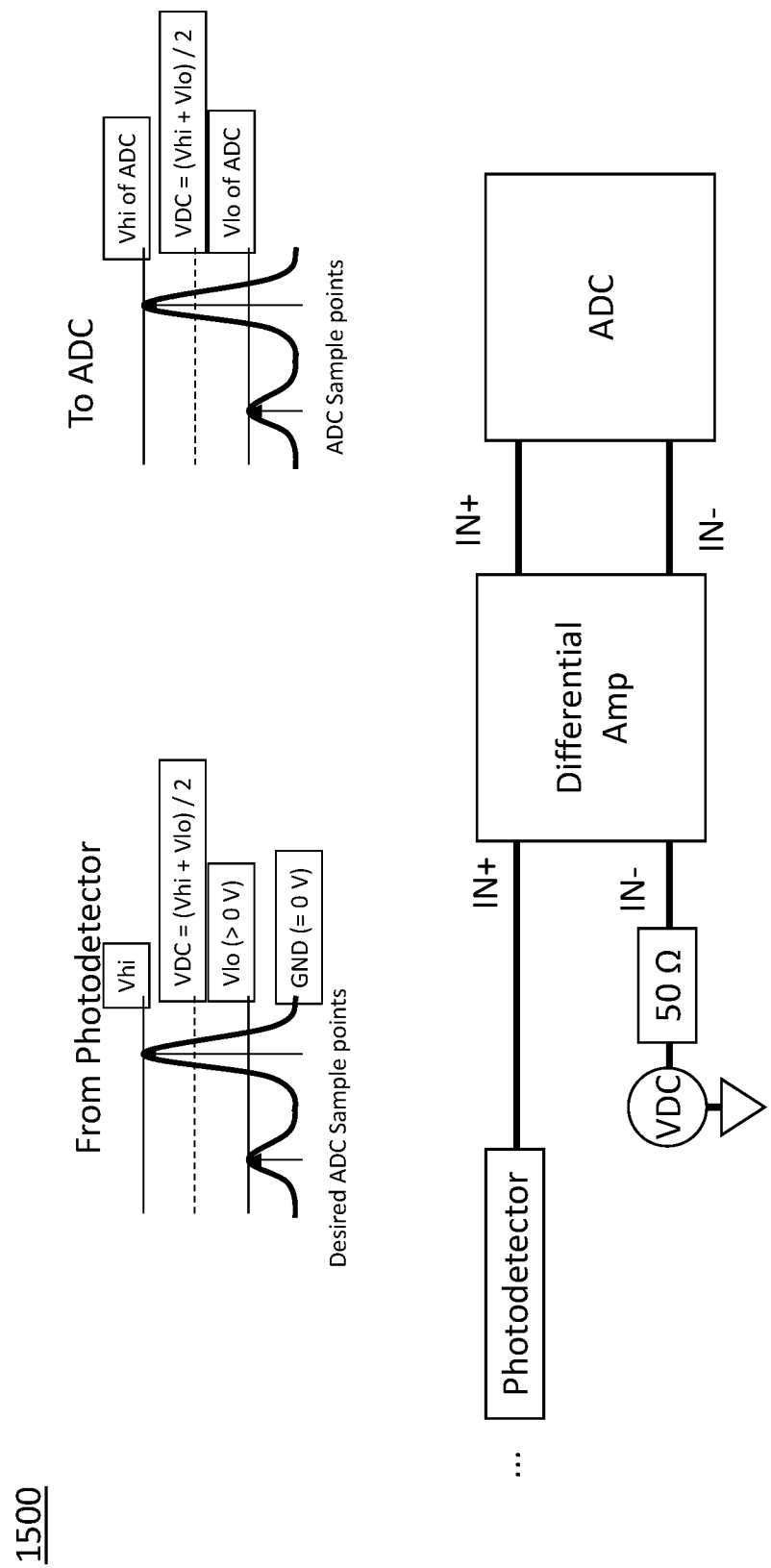
FIG. 15A illustrates an example of using a differential amplifier to generate a bi-polar voltage output in accordance with the present technology.
Figure 15B:
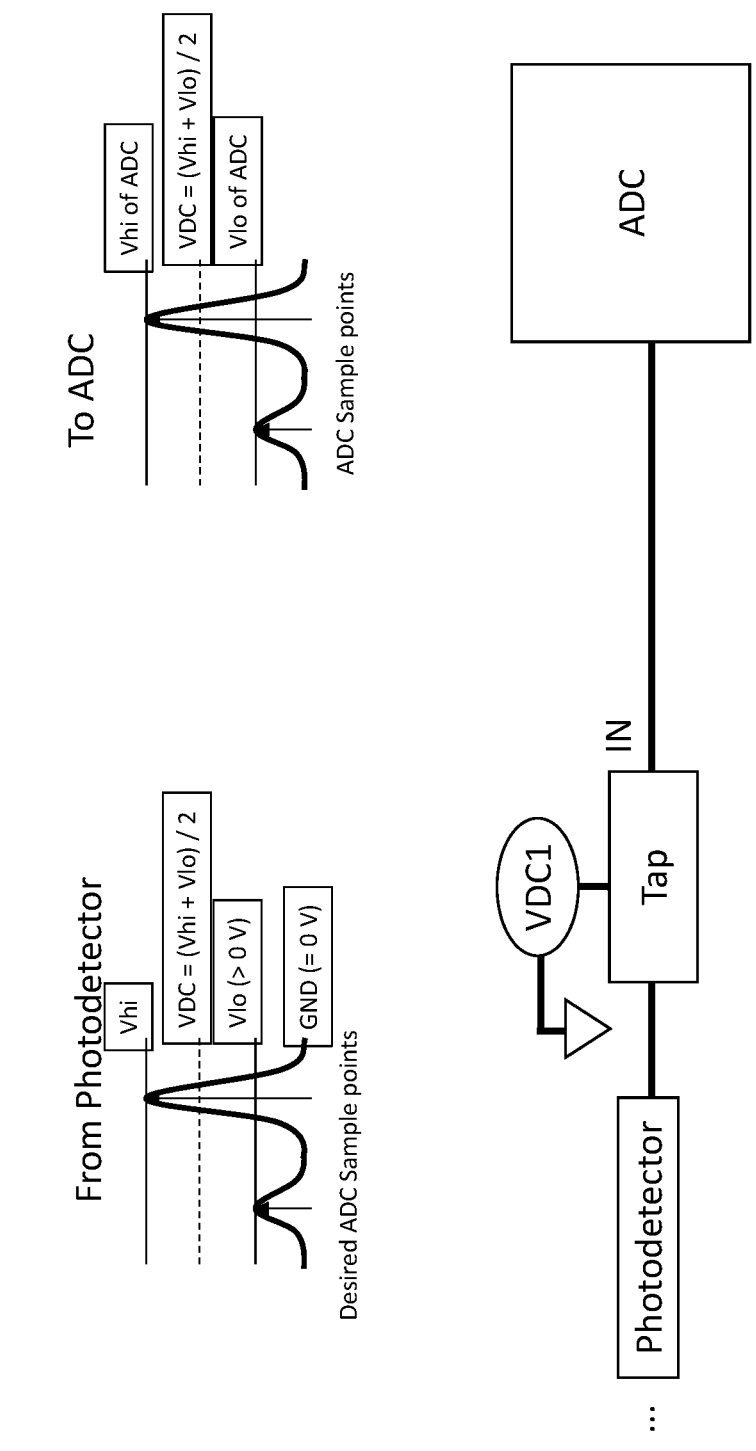
FIG. 15B shows an example of using a broadband resistor tap to achieve a bi-polar voltage output in accordance with the present technology.

An additional aspect of the disclosed technology relates to improving the ADC operation by producing bi-polar signals. In particular, output signals from photodetectors are often uni-polar (that is, from ground to positive voltages only). To maximize the full-scale usage of the ADC, one such uni-polar to bi-polar converter uses a differential amplifier to convert the uni-polar signal to a bi-polar signal. FIG. 15A illustrates an example 1500 of using a differential amplifier to generate a bi-polar voltage output in accordance with the present technology. The uni-polar output of the photodetector is provided to a differential amplifier. By applying a suitable DC voltage to the other input of the differential amplifier, the differential amplifier can produce a voltage output that is either negative or positive. For example, based on the highest level of voltage $V_{hi}$ and the lowest level of voltage $V_{lo}$, a DC voltage value of $(V_{hi}+V_{lo})/2$ can be applied to the second input of the different amplifier (e.g., via a series resistor) to fill the full scale of the ADC. Other components similar to the differential amplifier can be used, as well. FIG. 15B shows another example embodiment 1550 that uses a broadband resistor tap to convert a uni-polar voltage to a bi-polar voltage output in accordance with the present technology. By applying a voltage on the tap, the voltage value at the output of the tap can be either negative or positive, thereby filling the full scale of ADC to obtain high-performance systems.

In one example aspect, an optical encoder includes a polarization rotator configured to receive a train of optical pulses and an electro-optic (EO) modulator coupled to an output of the polarization rotator. The EO modulator is configured to receive a radio frequency (RF) signal and to produce a phase modulated signal in accordance with the RF signal. The optical encoder also includes a polarizing beam splitter coupled to the output of the EO modulator and an optical hybrid configured to receive two optical signals from the polarizing beam splitter and to produce four optical outputs that are each phase shifted with respect to one another.

In some embodiments, the EO modulator is an EO phase modulator. In some embodiments, the four optical outputs are phase shifted by 0, 90, 180 and 270 degrees, respectively. In some embodiments, the optical encoder further includes an optical transmission medium coupled to each of the four optical outputs to allow transmission of the four optical to a remote location.

In some embodiments, the optical encoder is implemented as part of an analog-to-digital conversion system that includes one or more photodetectors to receive and convert each of the four optical outputs into an associated electrical signal. In some embodiments, the analog-to-digital conversion system includes a digitizer to convert the electrical signals produced by the one or more photodetectors into digital signals. In some embodiments, the analog-to-digital conversion system further comprises a digital signal processor configured to receive the digital signals corresponding to the four optical outputs and determine a phase value indicative of the RF signal value. In some embodiments, determination of the phase value is carried out by unwrapping a wrapped phase value associated with the four optical outputs. In some embodiments, the analog-to-digital conversion system includes an RF tap configured to receive an unattenuated version of the RF signal and to produce a weak and a strong copy of the RF signal. The strong copy is provided to the EO modulator as the RF signal and the weak copy of the RF signal is usable for conducting a phase unwrapping operation. In some embodiments, the analog-to-digital conversion system includes a digitizer configured to receive the weak copy, and a digital signal processor to unwrap the wrapped phase value associated with the four optical outputs using the weak copy. In some embodiments, the weak copy is used for determination of a coarse phase value and signals obtained based on the four optical outputs are used for determination of a fine phase value.

In some embodiments, the polarization rotator and the EO modulator are part of an interferometer formed using single waveguide.

In another example aspect, an optical encoder system includes a radio frequency (RF) tap for receiving an RF signal to produce a first version of the RF signal and a second version of the RF signal, and an optical four quadrature amplitude modulator (FQAM) configured to receive an optical pulse train and the second version of the RF signal and to produce four optical outputs having phases that are shifted with respect to one another. The four optical outputs enable a determination of a fine phase value associated with the RF signal and a determination of a coarse phase value associated with the RF signal is enabled based on the first version of the RF signal.

In some embodiments, the optical encoder includes a beam splitter or a splice configured to provide, at its first optical output, a version of the optical pulse train for use by the FQAM for production of the four optical outputs. The FQAM also includes an electrooptic amplitude modulator positioned to receive the first version of the RF signal and a second optical output of the beam splitter or splice. The determination of the coarse phase value is enabled using an output of the electrooptic amplitude modulator.

In another example aspect, a system for performing analog-to-digital conversion includes a radio frequency (RF) tap configured to receive an RF signal to produce a first version of the RF signal and a second version of the RF signal, an optical subsystem configured to receive at least a train of optical pulses and to generate four optical outputs having phases that are shifted with respect to one another, and a digitizer configured to generate five channels of digitized signals based on the first version of the radio-frequency signal and the four optical outputs of the optical subsystem. The five channels of digitized signals enable a determination of a modulated phase value by determining a coarse phase value based on the first version of the RF signal and a fine phase value based on the digitized signals associated with the four optical outputs of the optical subsystem.

In some embodiments, the system further includes one or both of: a dispersion element positioned to receive the train of optical pulses and to produce a train of pulses with spectral contents that are spread in time, or an optical amplifier to receive the train of optical pulses and to produce an amplified optical pulse train.

In some embodiments, the system further includes a digital processor configured to determine the coarse and the fine phase values. In some embodiments, the digital processor is configured to estimate phase information at least in-part by sequentially adding a phase delta of a times an integer for a jump in the digitized signals. In some embodiments, the digital processor is configured to estimate phase information at least in-part by: subtracting digital representations of a third one of the four optical outputs from a first one of the optical outputs; and subtracting a fourth one of the four optical outputs from a second one of the four optical outputs.

In another example aspect, an optical encoding system for an analog-to-digital conversion includes a tap configured to receive an unattenuated version of a radio-frequency (RF) signal and to produce a weak and a strong copy of the RF signal, an electro-optic (EO) amplitude modulator configured to receive the weak copy of the RF signal and a train of optical pulses to produce an amplitude modulated signal in accordance with the weak copy, and an EO phase modulator configured to receive the train of optical pulses through a polarization rotator. The EO modulator is further configured to receive the strong copy of the RF signal and to produce a phase modulated signal in accordance with the strong copy. The optical encoding system also includes a first optical transmission medium coupled to an output of the EO amplitude modulator to allow transmission of the amplitude modulated signal to a remote location, a second optical transmission medium coupled to an output of the EO phase modulator to allow transmission of the phase modulated signal to the remote location, an integrated optical system residing at the remote location to receive the phase modulated signal and to produce four optical outputs that are each phase shifted with respect to one another, one or more photodetectors to receive the amplitude modulated signal and the four optical outputs of the integrated optical system and to produce electrical signals corresponding thereto, and a digitizer to generate five channels of digitized signals based on the signal received via the first optical transmission medium corresponding to the weak copy of the RF signal and signals associated with the four optical outputs of the integrated optical system. The five channels of digitized signals enable a determination of a modulated phase value by determining a coarse phase value based on the digitized signal corresponding to the weak copy of the RF signal and a fine phase value based on the digitized signals associated with the four optical outputs of the integrated sub system.

In yet another example aspect, an optical encoder system includes one or more electro-optic modulators configured to receive an RF signal and a train of optical pulses to produce one or more modulated signals in accordance with the RF signal, one or more photodetectors to receive the modulated signals to produce uni-polar electrical signals corresponding thereto, and one or more uni-polar to bi-polar converters configured to receive the unipolar electrical signals and to produce average-level-modified electrical signals to substantially fill a full-scale of subsequent digitizers.

At least parts of the disclosed embodiments (e.g., the DSP unit) can be implemented in digital electronic circuitry, or in computer software, firmware, or hardware. For example, electronic circuits can be used to control the operation of the detector arrays and/or to process electronic signals that are produced by the detectors. At least some of those embodiments or operations can be implemented as one or more computer program products, i.e., one or more modules of computer program instructions encoded on a computer-readable medium for execution by, or to control the operation of, data processing apparatus. The computer-readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read-only memory or a random-access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Computer-readable media suitable for storing computer program instructions and data include all forms of non-volatile memory, media and memory devices, including, by way of example, semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described, and other implementations, enhancements and variations can be made based on what is described and illustrated in this patent document.

What is claimed is:

1. An optical encoder, comprising:
   a polarization rotator configured to receive a train of optical pulses and to impart a polarization rotation to the train of optical pulses;
   an electro-optic (EO) modulator coupled to an output of the polarization rotator, the EO modulator configured to receive a radio frequency (RF) signal and to produce a phase modulated signal in accordance with the RF signal;
   a polarizing beam splitter coupled to the output of the EO modulator; and
   an optical hybrid configured to receive two optical signals from the polarizing beam splitter and to produce, based on the two optical signals, four optical outputs that are each phase shifted with respect to one another,
   wherein the optical encoder is implemented as part of an analog-to-digital conversion system, the analog-to-digital conversion system including:
      one or more photodetectors to receive and convert each of the four optical outputs into an associated electrical signal, and
      a digitizer to convert the electrical signals produced by the one or more photodetectors into digital signals,
      wherein the analog-to-digital conversion system further comprises a digital signal processor configured to:
      receive the digital signals corresponding to the four optical outputs; and
      determine a phase value indicative of the RF signal that includes unwrapping a wrapped phase value associated with the four optical outputs.

2. The optical encoder of claim 1, wherein the EO modulator is an EO phase modulator.

3. The optical encoder of claim 1, wherein the four optical outputs are phase shifted by 0, 90, 180 and 270 degrees, respectively.

4. The optical encoder of claim 1, further comprising an optical transmission medium coupled to each of the four optical outputs to allow transmission of the four optical outputs to a remote location.

5. The optical encoder of claim 1, wherein the polarization rotator and the EO modulator are part of an interferometer formed using a single waveguide.

6. The optical encoder of claim 1, wherein a plurality of the four optical outputs include information representing the RF signal.

7. The optical encoder of claim 6, wherein the RF signal is proportional to an arctangent of a ratio of: a difference between a first pair of the four optical outputs and a second pair of the four optical outputs.

8. The optical encoder of claim 7, wherein the optical outputs in each of the first and second pair of the optical outputs are phase shifted by 180 degrees with respect to each other.

9. The optical encoder of claim 1, further including one or both of:
   a dispersion element positioned to receive the train of optical pulses and to spread spectral content of the optical pulses prior to reaching the polarization rotator, or
   an optical amplifier positioned to receive the train of optical pulses and to produce an amplified optical pulse train prior to reaching the polarization rotator.

10. The optical encoder of claim 1, comprising a laser light source configured to generate the train of optical pulses.

11. The optical encoder of claim 1, wherein the digital signal processor is configured to:
    determine the wrapped phase value based on an arctangent value of: a difference between digital signals representing a first pair of the four optical outputs and an amplitude difference between digital signals representing a second pair of the four optical outputs; and
    determine an unwrapped phase value from the wrapped phase value.

12. The optical encoder of claim 11, wherein the digital signal processor is configured to determine the unwrapped phase value by determining a coarse phase value followed by determining a fine phase value.

13. The optical encoder of claim 12, wherein the coarse phase value represents a level associated with a helical phase representation, and the fine phase value represents a location within a given helix of the helical phase representation.

14. The optical encoder of claim 1, wherein the polarization rotator is a reversed fiber optic polarization beam splitter.

15. The optical encoder of claim 1, wherein the polarization rotator is a 45-degrees splice.

16. An analog-to-digital (A/D) convertor for optical signals, comprising:
    one or more photodetectors to receive optical signals and to produce unipolar electrical signals corresponding thereto; and
    one or more uni-polar to bi-polar converters configured to receive the unipolar electrical signals and to produce average-level-modified electrical signals to substantially fill a full-scale of subsequent digitizers.

17. The A/D convertor of claim 16, wherein the one or more uni-polar to bi-polar converters includes a differential amplifier with a first input configured to receive the unipolar electrical signals from the photodetector and a second input that is configured to maintain a DC voltage value to allow a difference in outputs of the differential amplifier to have values in a range of negative to positive numbers, the DC voltage value being an average voltage level associated with the uni-polar electrical signals.

18. The A/D convertor of claim 16, wherein the one or more uni-polar to bi-polar converters includes a broadband resistor tap with a first input configured to receive the unipolar electrical signals from the photodetector and a tap input that is configured to maintain a DC voltage value to allow an output of the broadband resistor tap to have values in a range of negative to positive numbers.

19. The A/D convertor of claim 16, wherein the A/D convertor is part of an optical encoder that includes one or more electro-optic modulators configured to receive an RF signal and a train of optical pulses to produce one or more modulated optical signals in accordance with the RF signal, wherein the one or more photodetectors are configured to receive the one or more modulated optical signals.

\* \* \* \* \*